United States Patent [19]

Mori

[11] Patent Number: 6,004,631
[45] Date of Patent: Dec. 21, 1999

[54] APPARATUS AND METHOD OF REMOVING UNNECESSARY MATTER AND COATING PROCESS USING SUCH METHOD

[75] Inventor: Kozo Mori, Suwa, Japan

[73] Assignee: Seiko Epson Corporation, Tokyo, Japan

[21] Appl. No.: 08/598,083

[22] Filed: Feb. 7, 1996

[30] Foreign Application Priority Data

Feb. 7, 1995 [JP] Japan ................................. 7-019192
Nov. 22, 1995 [JP] Japan ................................. 7-328146

[51] Int. Cl.$^6$ ........................... B04D 3/00; H01L 21/465; H01L 21/4757
[52] U.S. Cl. ............................ 427/534; 216/71; 216/67; 216/23; 427/535; 427/536; 427/240; 538/694; 538/710; 538/723; 538/725; 538/729; 538/730; 538/735; 538/743; 134/1.2; 438/782
[58] Field of Search ...................... 427/240, 534, 427/535, 539, 536; 438/780, 782, 759, 694, 710, 712, 716, 723, 725, 729, 730, 735, 743; 134/1.1, 1.2, 1.3; 216/67, 71, 23

[56] References Cited

U.S. PATENT DOCUMENTS

| | | | |
|---|---|---|---|
| 3,762,941 | 10/1973 | Hou | 117/93.1 |
| 4,012,307 | 3/1977 | Phillips | 204/192 |
| 4,277,304 | 7/1981 | Horiike et al. | 438/730 |
| 4,430,547 | 2/1984 | Yoneda et al. | 219/121 |
| 4,510,176 | 4/1985 | Cuthbert et al. | 427/240 |
| 4,555,303 | 11/1985 | Legge et al. | 427/534 |
| 4,705,593 | 11/1987 | Haigh et al. | 156/635 |
| 4,708,766 | 11/1987 | Hynecek | 156/635 |
| 4,749,440 | 6/1988 | Blackwood et al. | 156/646 |
| 4,857,382 | 8/1989 | Liu et al. | 428/156 |
| 4,921,157 | 5/1990 | Dishon et al. | 228/124 |
| 5,000,819 | 3/1991 | Pedder et al. | 156/643 |

(List continued on next page.)

FOREIGN PATENT DOCUMENTS

| | | |
|---|---|---|
| 371693 | 6/1990 | European Pat. Off. |
| 60-1861 | 1/1985 | Japan . |
| 61-127866 | 6/1986 | Japan . |
| 2-190489 | 7/1990 | Japan . |
| 2-281734 | 11/1990 | Japan . |
| 3-174972 | 7/1991 | Japan . |
| 3-219082 | 9/1991 | Japan . |
| 3-219082 | 10/1991 | Japan . |
| 3-236475 | 10/1991 | Japan . |
| 4-186619 | 7/1992 | Japan . |
| 6-190269 | 12/1992 | Japan . |
| 5-082478 | 4/1993 | Japan ............................ H01L 27/08 |
| 6-2149 | 1/1994 | Japan . |

OTHER PUBLICATIONS

59–158525 Sept. 8, 1984 Japan Abstract Only.

*Primary Examiner*—Marianne Padgett
*Attorney, Agent, or Firm*—Stroock & Stroock & Lavan LLP

[57] ABSTRACT

An apparatus for removing unnecessary matter formed on an edge portion of a substrate without damaging a middle area of a top face of the substrate is provided. The substrate is supported on a stage which is in contact only with a bottom face of the substrate. An activated gas supply device is located opposed to the stage and includes a ring-shaped electrode and a cover electrode surrounding the ring-shaped electrode. The cover electrode includes a gas outlet formed therethrough. Activated species and excited molecules formed from an atmospheric plasma are blown against the edge portion of the substrate through the gas outlet. The activated species and excited molecules and unnecessary matter removed form the edge portion of the substrate through reaction with the activated species and excited molecules, is exhausted along a side face of the edge portion of the substrate and away from the middle area through an exhausting device. A carrier gas supply may be also provided to blow a carrier gas against the middle area of the substrate. The carrier gas is then conducted from the middle area to the edge portion of the substrate so that the carrier gas prevents the activated gas from moving around to the middle area of the substrate.

15 Claims, 15 Drawing Sheets

U.S. PATENT DOCUMENTS

| | | | |
|---|---|---|---|
| 5,045,166 | 9/1991 | Bobbio | 204/192 |
| 5,087,341 | 2/1992 | Tsukada et al. | 216/71 |
| 5,110,407 | 5/1992 | Ono et al. | 427/534 |
| 5,120,568 | 6/1992 | Schuurmans et al. | 427/37 |
| 5,126,164 | 6/1992 | Okazaki et al. | 427/39 |
| 5,147,520 | 9/1992 | Bobbio | 204/192 |
| 5,178,682 | 1/1993 | Tsukamoto et al. | 118/722 |
| 5,201,995 | 4/1993 | Reisman et al. | 156/646 |
| 5,225,659 | 7/1993 | Kusano et al. | 249/121 |
| 5,240,559 | 8/1993 | Ishida | 456/666 |
| 5,290,378 | 3/1994 | Kusano et al. | 156/272 |
| 5,292,370 | 3/1994 | Tsai et al. | . |
| 5,308,447 | 5/1994 | Lewis et al. | 216/67 |
| 5,316,739 | 5/1994 | Yoshikawa et al. | 422/186 |
| 5,340,618 | 8/1994 | Tanisaki et al. | 427/488 |
| 5,368,685 | 11/1994 | Kumihashi et al. | 156/643 |
| 5,372,674 | 12/1994 | Steinberg | 216/67 |
| 5,384,167 | 1/1995 | Nishiwaki et al. | 427/569 |
| 5,391,855 | 2/1995 | Tanisaki | . |
| 5,399,830 | 3/1995 | Maruyama | . |
| 5,407,121 | 4/1995 | Koopman et al. | 228/206 |
| 5,449,432 | 9/1995 | Hanawa | . |
| 5,474,640 | 12/1995 | Ve et al. | 216/71 |
| 5,474,642 | 12/1995 | Zorina et al. | . |
| 5,499,754 | 3/1996 | Bobbio et al. | 228/42 |
| 5,549,780 | 8/1996 | Koinuma et al. | 156/643.1 |
| 5,597,438 | 1/1997 | Grewal et al. | . |
| 5,688,555 | 11/1997 | Teng | 427/240 |
| 5,693,241 | 12/1997 | Banks et al. | 216/67 |
| 5,722,581 | 3/1998 | Sindzingre et al. | 134/1.1 |

APPARATUS AND METHOD OF REMOVING UNNECESSARY MATTER AND COATING PROCESS USING SUCH METHOD

BACKGROUND OF THE INVENTION

The present invention relates generally to an apparatus and method of removing unnecessary matter on an edge portion of a substrate or other workpiece, such as a semiconductor wafer or a liquid crystal display device. Particularly, the present invention relates to an apparatus and method suitable for removing the thick raised part of coating on a substrate about its edge portion (i.e., the portion at the outer perimeter of the substrate) when the coating has been applied through, for example, a conventional spin coating process. The present invention also relates to a spin coating process which includes using a method of removing the thick raised unnecessary matter at the edge portion of the substrate.

According to methods well known in the prior art, an insulation or mask layer may be formed on a substrate by spin coating a liquid glass material (SOG: Spin On Glass), organic resist, polyimide or the like on a substrate or other workpiece, such as a semiconductor wafer or liquid crystal display device. Further, a thin film may also be formed on the substrate of a liquid crystal panel through a spin coating process. In the spin coating process, the substrate is rotated about an axis orthogonal to the surface to be coated and the coating material is applied on the surface at a point near the axis of rotation. The coating is spread out over the middle area of the substrate into a substantially uniform thickness from the centrifugal force driving it away from the point near the axis of rotation and towards the perimeter edge portion.

However, these prior art spin coating processes have the disadvantage that the coating formed on the edge portion of the substrate tends to have a greater thickness than the coating at the middle area thereof, and thus forms a thick raised part containing unnecessary matter on the edge portion of the substrate or other workpiece.

If a coated semiconductor wafer or liquid crystal panel formed from the spin coating process is then utilized as a workpiece for some other operation device, for example, if the substrate is conveyed by a conveyor or housed in a transportation cassette, or placed on a stage in an ion-implantation device or dry-etching device, the raised part on the edge portion of the substrate may easily be fractured and create dust. Such dust may deposit on the substrate causing contamination or may cause contamination of the operation device. This raises the problem of the yield being greatly reduced for the semiconductor production.

In order to remove this unnecessary raised part of coating about the edge portion of the substrate which typically forms during the spin coating process, it has been previously proposed that after the spin coating step is performed, a series of photolithographic steps be carried out. These photolithographic steps include a resist coating step, an edge exposing step, a developing and baking step, a wet-etching step and a resist removing step. Since these photolithographic steps may require a prolonged time (e.g., on the order of one to three hours), the efficiency of production of finished semiconductor wafers or liquid crystal panels is undesirably reduced.

Depending on the product to be formed, the resist removing step can occur simultaneously with the other mask forming and etching steps which may already be used in the procedure of manufacturing the semiconductor wafer or liquid crystal display panel. Since the raised part of the coating still exists on the edge portion of the substrate prior to the mask forming and etching steps, however, the reduction of yield due to creation of dust which contaminates the finished product can not be avoided.

Japanese Patent Laid-Open No. Hei 5-82478 discloses a method and apparatus for etching the end faces of a semiconductor wafer by using atmospheric plasma The method described therein includes grasping the middle area of the semiconductor wafer between upper and lower disc-like holders in a circumferential reaction chamber and exposing the semiconductor wafer only at its edge portion thereof to an atmospheric plasma treatment. The outermost peripheries of the upper and lower disc-like holders carry an O-ring packing at their circumference which not only may grasp the semiconductor wafer, but also may form an air-tight seal separating the middle area of the semiconductor wafer from the raised edge portion of the semiconductor wafer.

The technique described therein requires bringing the O-rings into firm contact with the middle area of the semiconductor wafer. However, often in the middle area of the semiconductor wafer, active elements and electronic components are formed. Thus, these surface structures, such as the active elements and electronic components, may be damaged by the pressure exerted by the O-rings. Additionally, dust may yet continue to be deposited on the middle area of the semiconductor wafer, thus degrading the efficiency of production.

SUMMARY OF THE INVENTION

Generally speaking, in accordance with the present invention, a method of removing unnecessary matter on an edge portion at the perimeter of a substrate or other workpiece, where the substrate includes a middle area on the top face on which may be formed active elements or other electrical components is described. The method comprises the steps of supporting the substrate or other workpiece by a support contacting only with the bottom face of the substrate. Then an AC voltage is applied across a pair of plasma generating electrodes. These plasma generating electrodes are disposed in a gas supply path in which a gas capable of plasma discharge is flowing. Thus, a plasma at our about atmospheric pressure is generated. The plasma activates the gas in the gas supply path to form active species. Then, the active species are blown against the edge portion of the substrate through a gas outlet which is directed towards the edge portion, and which in particular, is disposed at a position opposed to the top face of the edge portion containing the unnecessary matter. In this way, the unnecessary matter from the edge portion of the substrate is removed by reaction between the unnecessary matter and the active species. Finally, the activated gas and the removed unnecessary matter is exhausted, along the side face of the edge portion of the substrate or other workpiece and away from the middle area thus preventing any dust from settling on the middle area.

To embody such a method, the present invention is also directed to an apparatus for removing unnecessary matter on the edge portion of a substrate or other workpiece, where the substrate includes a middle area on its top face. The apparatus comprises a support member which makes contact with only the bottom face of the substrate or other workpiece. Additionally, a gas supply having a gas outlet formed at a position opposed to the top face of the edge portion of the substrate supported by the support has a gas supply supplying a gas capable of plasma discharge to the edge portion of the substrate through an outlet. A pair of plasma generating electrodes is disposed upstream of the gas outlet in the gas supply. These plasma generating electrodes may have an AC voltage applied across them to thereby generate plasma at or about atmospheric pressure in the gas. An exhaust for directing, along a side face of the edge portion of the substrate or other workpiece, activated species of the gas generated by the plasma and the unnecessary matter removed from the edge portion of the substrate by reaction with the activated species, is also provided.

According to the method and apparatus of the present invention, a gas capable of plasma discharge is activated by the plasma generated by an AC current across a pair of plasma generating electrodes. The activated species of the gas is then blown against a top face of a substrate at the edge portion of a substrate where the activated species can react with the material of the unnecessary matter on the edge portion of the substrate to thereby remove the unnecessary matter from the substrate. The activated gas and removed unnecessary matter are directed along the side face of the edge portion of the substrate or other workpiece by an exhaust stream. Therefore, the activated gas will be prevented from reacting with the middle area of the substrate containing active elements and electronic components, nor will dust of the removed unnecessary matter deposit on this middle area of the substrate or other workpiece.

In another aspect of the present invention, there is provided a method of removing unnecessary matter on an edge portion of a substrate, on which a middle area of the top face of the substrate has formed thereon active elements or electronic components. The method comprises the steps of supporting the substrate by a support contacting only with the bottom face of the substrate or other workpiece. Then, an AC voltage is applied across a pair of plasma generating electrodes disposed in a gas supply path having a gas capable of generating plasma flowing through it to generate plasma at or about atmospheric pressure. The plasma activates the gas in the gas supply path forming activated species of the gas. Finally, the activated species are blown against the edge portion of the substrate through a gas outlet which is disposed at a position opposed to the edge portion of the substrate or other workpiece. Thus, the unnecessary matter from the edge portion of the substrate is removed by reaction with the activated species. Additionally, an inert carrier gas is blown against the middle area of the top face of the substrate and the carrier gas is conducted from the middle area to the edge portion of the substrate so that the carrier gas prevents the activated species and dust of the unnecessary matter from moving to the middle area of the substrate. According to the method and apparatus of the present invention, the activated species and the unnecessary matter removed from the substrate or other workpiece by reaction with the activated species are directed outwardly from the edge portion of the substrate or other workpiece by the inert carrier gas. Thus, the activated species and unnecessary matter are prevented from being moved toward the active elements and electronic components on the middle area of the substrate or other workpiece. In this embodiment, the activated gas may be blown against the edge portion of the substrate from the lateral side thereof, rather than from above the top face of the substrate.

A preferred embodiment of the present invention includes a step of blowing a portion of the gas being supplied through the gas supply path directly against the middle area of the substrate or other workpiece without exposing that portion of the gas to the plasma Thus, the same gas supplied through the gas supply path can be used for providing gas to be activated by the plasma to form the activated species and also for providing the inert carrier gas not exposed to the plasma.

The carrier gas may also be inexpensive nitrogen or air supplied through a separate path different from the gas supply path. If an electrode structure used is of such a type that no discharge will be created in the middle area, the carrier gas may be any other inert gas, such as helium, argon or the like.

It is further preferred that the activated species, inert carrier gas and removed unnecessary matter are exhausted away from the substrate.

The substrate may be a semiconductor wafer or liquid crystal display device which has a relatively flat portion formed along a part of the generally circular perimeter of the edge portion. In such a case, the pair of plasma generating electrodes includes an electrode part having a configuration corresponding to the flat portion of the substrate.

The above method will generally include a step of conducting the substrate or other workpiece onto the support while the flat portion of the edge portion is positioned in a particular given direction, thereby setting the flat portion of the substrate at a position directly opposed to the electrode part corresponding to this portion. Thus, the unnecessary matter existing along the flat portion can also effectively be removed.

It is further preferable that the gas supply includes a passage shaped to essentially correspond to the shape of the periphery of the workpiece (e.g. annular in the case of a circular workpiece) formed therein at a position directly opposed to the edge portion of the substrate or other workpiece supported by the support. The gas outlet may be formed in this gas passage to blow the activated gas directly against the edge portion of the substrate.

The annular gas passage may be formed of electrically conductive material and an annular electrode may be formed within this annular gas passage. Thus, the annular gas passage itself and electrode will form the pair of plasma generating electrodes. If the substrate is a semiconductor wafer or liquid crystal display device having a flat portion in the edge portion, the annular gas passage and electrode will have a configuration corresponding to the flat portion of the substrate. Therefore, the unnecessary matter existing along the flat portion can effectively be removed.

The gas supply preferably includes inner and outer cylindrical walls connected to each other through a plurality of intermediate support members, a shielding plate for shielding the inner passage of the inner cylindrical wall and a top cover member having a pipe for supplying a gas capable of discharge into the gas passage formed between the inner and outer cylindrical walls. This facilitates the assembly of the gas supply. In this case, it is required that the gas passage between the inner and outer cylindrical walls communicates with the ring-shaped gas passage.

In a further aspect of the present invention, there is provided a method of removing unnecessary matter from an edge portion of a substrate, on which a middle area of the top face of the substrate has formed thereon active elements and electrical components. The method comprises the steps of supporting the substrate by a support contacting only with the bottom face of the substrate. Then, applying an AC voltage across a pair of plasma generating electrodes disposed on opposite sides of the edge portion of the substrate and supplying a gas capable of plasma discharge between the pair of plasma generating electrodes to generate plasma at or about atmospheric pressure near the edge portion of the substrate. The plasma activates the gas generating activated species. Thus, the unnecessary matter from the edge portion of the substrate is removed by reaction with the activated species. Finally, the activated gas and removed unnecessary matter is directed along a side face of the edge portion of the substrate and away from the middle area.

To embody such a method, the present invention provides an apparatus for removing unnecessary matter on an edge portion of a substrate, on which a middle area of the top face of the substrate has active elements and electrical components. The apparatus comprises a support contacting only with the bottom face of the substrate. A pair of plasma generating electrodes are disposed on opposite sides of the edge portion of the substrate supported by the support. A gas supply supplies a gas capable of discharge to the space between the pair of plasma generating electrodes. An exhaust directs the active species of the gas formed by the plasma generated by the pair of plasma generating electrodes, and also directs the unnecessary matter removed from the edge portion of the substrate by reaction with the activated species, along a side face of the middle area of the substrate and away from the middle area.

According to this method and apparatus, the plasma can be formed between the pair of plasma generating electrodes disposed opposite to each other on either side of the edge portion of the substrate, thereby exposing the edge portion of the substrate directly to the plasma. When the gas capable of plasma is activated by the plasma generated near the edge portion of the substrate, the unnecessary matter is removed by reaction with the plasma as well as the activated species and the rate of removal is increased. Since the activated species and removed unnecessary matter are directed away from the substrate by the exhaust, the middle area of the substrate containing the active elements and electrical components can be protected from the activated species, the plasma and the removed unnecessary matter and will not be contaminated by the dust, and therefore less contamination will occur and a better manufacturing efficiency obtained.

The support generally includes an electrically non-conductive placing portion on which the bottom face of the middle area of the substrate is placed, and a ring-shaped annular electrode portion disposed opposite and with a slight gap to the bottom face of the edge portion of the substrate. The placing portion and the ring-shaped annular electrode portions are integrally formed. Thus, the ring-shaped annular electrode portion may form one electrode of the pair of plasma generating electrodes. In this configuration, the activated species can move around to the bottom face of the edge portion of the substrate to remove any unnecessary matter that may be there also, that is, from the bottom face of the edge portion of the substrate.

The pair of plasma generating electrodes may include a first electrode portion disposed at an area opposite to the edge portion of the substrate, a second electrode portion disposed at a position opposite to the first electrode portion on the other side of the edge portion and an insulation connection connecting the first and second electrode portions. The gas outlet of the gas supply may be formed in this insulation connection. The insulation connection may also include exhaust ports formed therein adjacent to the gas outlets for directing the activated species and removed unnecessary matter away from the middle area.

If the substrate is a semiconductor wafer having a generally circular edge portion and a flat edge portion, the pair of plasma generating electrodes may be formed by a pair of electrode portions positioned opposite to only a part of the edge portion of the substrate. In such a case, it is required that the apparatus further includes a device for rotatably driving the support and also for moving the support relative to the pair of plasma generating electrodes along the flat edge portion so that each portion of the edge portion may pass between the plasma generating electrodes.

It is preferred that the removing step in the above method further includes a step of rotating the substrate to remove the unnecessary matter from the circular edge portion of the substrate while sequentially changing the position of the circular edge portion relative to the pair of electrode portions, and a step of linearly changing the relative position between the substrate and the pair of electrode portions to remove the unnecessary matter from the flat edge portion of the substrate while sequentially changing the position of the flat portion relative to the pair of electrode portions.

According to this method, the unnecessary matter existing along the circular and flat edge portions of the semiconductor wafer can effectively be removed while using electrodes of smaller discharge area that treat a small part of the edge portion at a time.

The pair of plasma generating electrodes may also include a first half-circumferential electrode including a pair of electrode portions which are disposed opposite to a half-circumferential edge portion of the substrate, and a second half-circumferential electrode including a pair of electrode portions which are disposed opposite to the other half-circumferential edge portion of the substrate. In such a case, there is also required a device for creating relative movement between the support and the first and second half-circumferential electrodes so that the first and second half-circumferential electrodes will be positioned opposite to the respective half-circumferential edge portions of the substrate for treating the edge portions.

In this case, the step of removing the unnecessary matter includes moving the substrate and the first and second half-circumferential electrodes relative to each other. Thus, the respective half-circumferential edge portions of the substrate can be positioned opposite to the first and second half-circumferential electrodes. As a result, the unnecessary matter on the entire edge portion of the substrate can be removed.

The aforementioned method and apparatus embodiments of the present invention are preferably carried out after the spin-coating step. The unnecessary matter may include a thick coating material applied on the edge portion of the substrate through the spin-coating step.

Such coatings may include silicon oxide, organic resist and polyamide. Silicon oxide is a typical material of a SOG film. An organic resist is typically used as an etching mask and polyamide is typically used to flatten an under layer below a wiring layer of Al or the like.

If the gas capable of discharge contains fluorine, the removing step will include a step of etching and removing the unnecessary matter by the use of fluorine radicals reacting with the unnecessary matter.

If the gas capable of discharge contains oxygen, the removing step will include a step of ashing and removing the unnecessary matter by the use of oxygen radicals reacting with the unnecessary matter.

In the method of the present invention, it is preferable that the substrate supporting step includes a step of causing the support means to contact only with the middle area of the bottom face of the substrate, rather than contact with the bottom face of the edge portion of the substrate. Thus, the removing step can include conducting the activated species onto the bottom face of the edge portion. Therefore, the unnecessary matter formed on the bottom face of the edge portion can also be removed.

In the method of the present invention, the unnecessary matter removing step can be carried out as a second step after a first step of rotating the substrate to spin-coat the substrate, the second step being operative to remove the thick coating material applied onto the edge portion of the substrate through this spin coating step.

At this time, it is generally preferable that after a plurality of substrates have been subjected to the first step, the substrates are then sequentially moved to a stage for the second step one at a time, the first and second steps being carried out in line. As described, the unnecessary matter removing step of the present invention can greatly reduce the treatment time, unlike the conventional photolithograph steps of the prior art.

It is therefore an object of the present invention to provide a method and apparatus which can effectively remove unnecessary matter located specifically on or near the edge portion of a substrate or other workpiece in a relatively short time without damaging the middle area of the substrate or workpiece.

It is also an object to provide a coating process using a method of effectively removing unnecessary matter from an edge portion of a substrate in an efficient manner.

Another object of the present invention is to provide a method and apparatus which can effectively remove unnecessary matter on the entire perimeter of a substrate where the edge portions of the substrate or workpiece may have a flat portion on a part of the perimeter of the substrate or other workpiece contour, which may typically be used for orienting the substrate.

Still another object is to provide a coating process using a method of removing unnecessary matter on a substrate having a flat portion on a part of the perimeter.

Still other objects and advantages of the invention will in part be obvious and will in part be apparent from the specification.

The invention accordingly comprises the several steps and the relation of one or more of such steps with respect to each of the others, and apparatus embodying features of construction, combinations of elements and arrangements of parts which are adapted to effect such steps, all as exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which.

DETAILED DESCRIPTION OF THE PREFERRED EMBODIMENTS

Figure 2A:
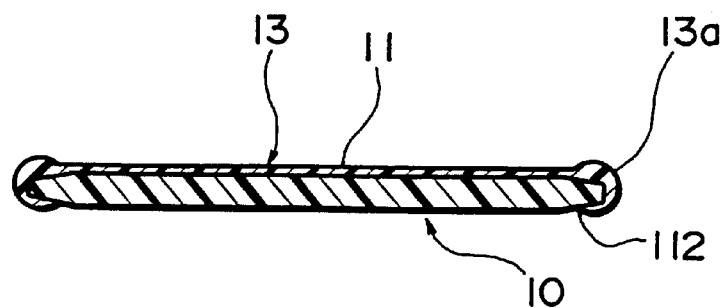
FIG. 2A is an elevational sectional view of a wafer on which an SOG film is formed before the removing step.
Figure 2B:
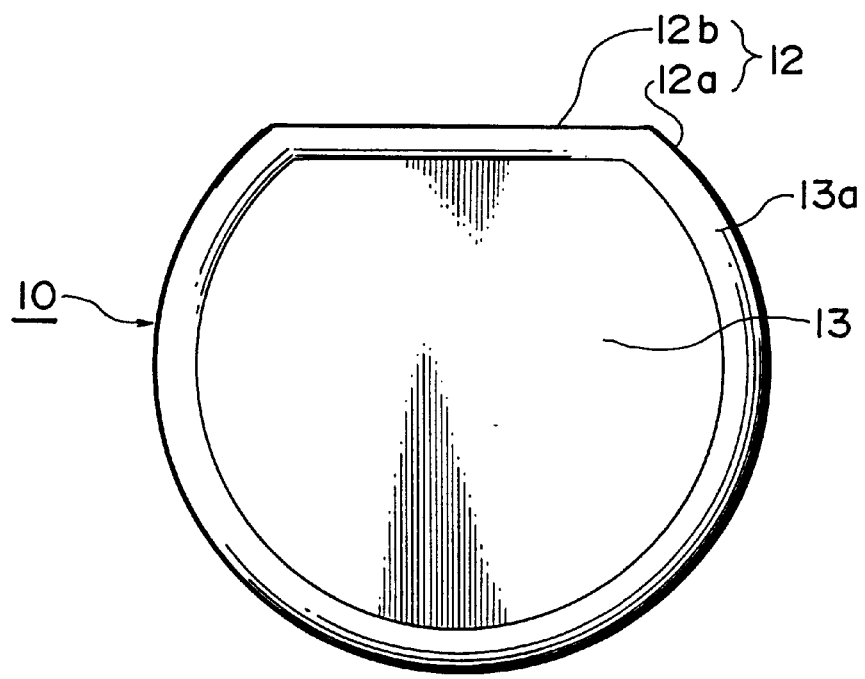
FIG. 2B is a plan view of the wafer shown in FIG. 2A.
Figure 3:
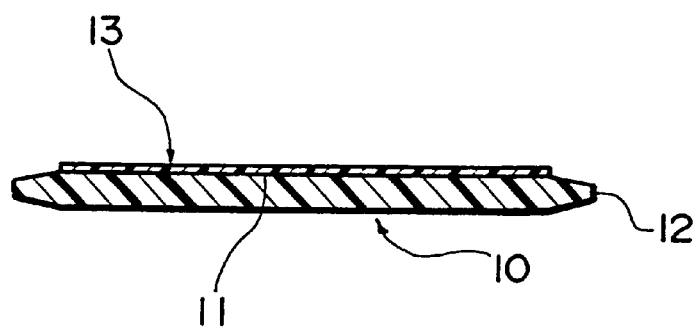
FIG. 3 is an elevational sectional view of the wafer after the removing step has been carried out.

Referring now to FIGS. 2A and 2B, a spin-on-glass (SOG) film 13 is formed on a silicon wafer 10 through the conventional spin coating process. In the first embodiment of the present invention, an atmospheric plasma is used for removing a thick raised rim portion 13a of the SOG film 13, formed on an edge portion 12 of silicon wafer 10, to yield silicon wafer 10 as shown in FIG. 3.

Figure 4:
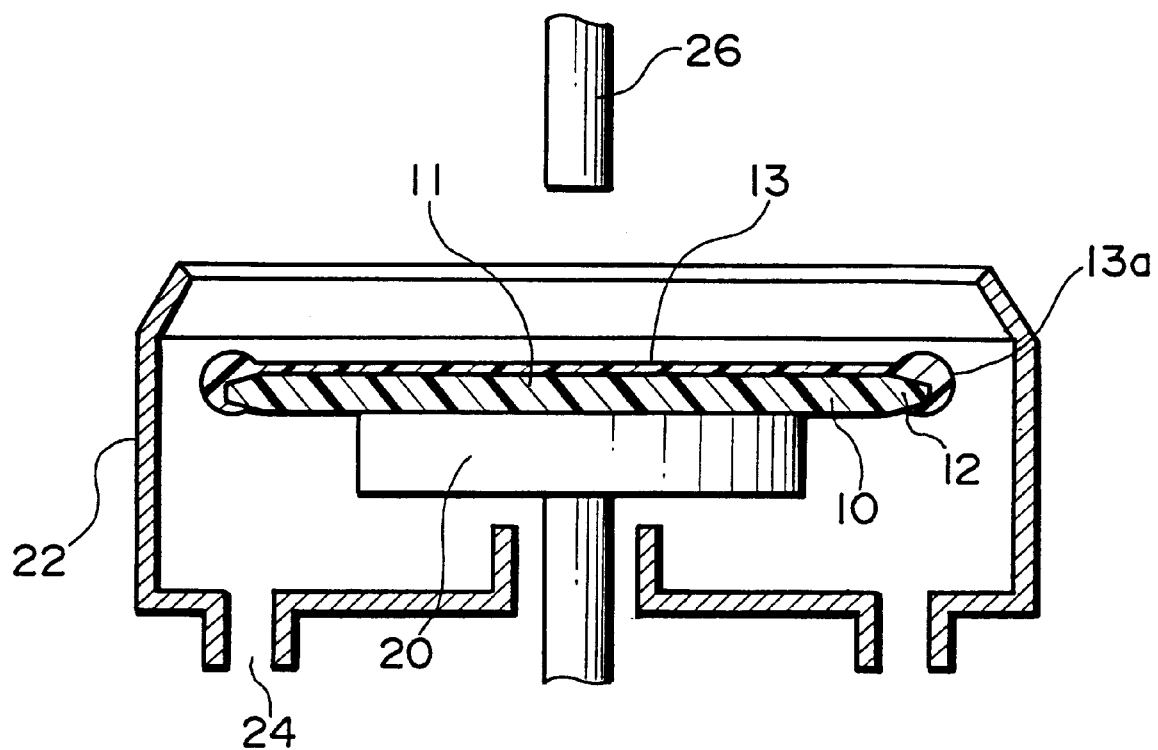
FIG. 4 is a schematic elevational sectional view of a coating device for forming a coating on a substrate in accordance with the present invention.

Referring to FIG. 4, the coating device comprises a spin chuck 20 for holding silicon wafer 10 under vacuum or the like and also for rotating silicon wafer 10 in the direction as shown by an arrow in FIG. 4. Silicon wafer 10 supported on the spin chuck 20 is surrounded by a cup 22 for conducting SOG flown off from silicon wafer 10 during the spin coating process into drains 24. The coating device further comprises a nozzle 26 for supplying a liquid solution onto silicon wafer 10 supported on spin chuck 20 to form SOG film 13.

In the coating device, the liquid solution is dropped onto silicon wafer 10 supported on spin chuck 20 through nozzle 26. Thereafter or simultaneously, spin chuck 20 is rotated in the direction of the arrow in FIG. 4 to spread the liquid solution over silicon wafer 10 under the action of centrifugal force for forming SOG film 13 thereon.

For example, SOG film 13 may have a substantially uniform thickness equal to about 100 nm at a middle area 11 of silicon wafer 10. On the other hand, rim portion 13a of SOG film 13 may have a thickness larger than that of the coating on middle area 11 of silicon wafer 10. A thicker coating is formed on edge portion 12 of silicon wafer 10 by the centrifugal force and the surface tension of the coating material. However, this thicker rim portion 13a is typically not at the portion of wafer where it covers middle area 11 and the active elements and electrical components, as shown in FIG. 4. Raised rim portion 13a is therefore unnecessary since it may produce undesirable dust during subsequent steps.

Now, also with reference to FIG. 2A, edge portion 12 of silicon wafer 10 is tapered to facilitate the flying off of liquid solution from edge portion 12, as seen best from FIG. 2A. Even if such an edge configuration is used, however, raised rim portion 13a is still formed on edge portion 12. Moreover, the liquid solution used to form SOG film 13 unnecessarily runs onto the bottom face of silicon wafer 10 and is dried on that portion as well.

As shown in FIG. 2B, edge portion 12 of silicon wafer 10 generally includes a circular portion 12a and a flat portion 12b which is typically used to orient wafer 10. Thus, raised rim portion 13a will be formed on edge portion 12 along circular portion 12a and flat portion 12b as well.

After wafer 10 is subjected to the coating step, silicon wafer 10 is subjected to a light baking step at about 150° C. and further to a hard baking step at a temperature usually between about 400° C. and 450° C. to provide a final composition substantially equal to $SiO_2$. In the first embodiment of the present invention, SOG film 13 formed on middle area 11 shown in FIG. 2A has a substantially uniform thickness which is about 100 nm. On the other hand, raised rim portion 13a formed on edge portion 12 of silicon wafer 10 has an extremely large thickness which may be about 10 μm.

Figure 1:
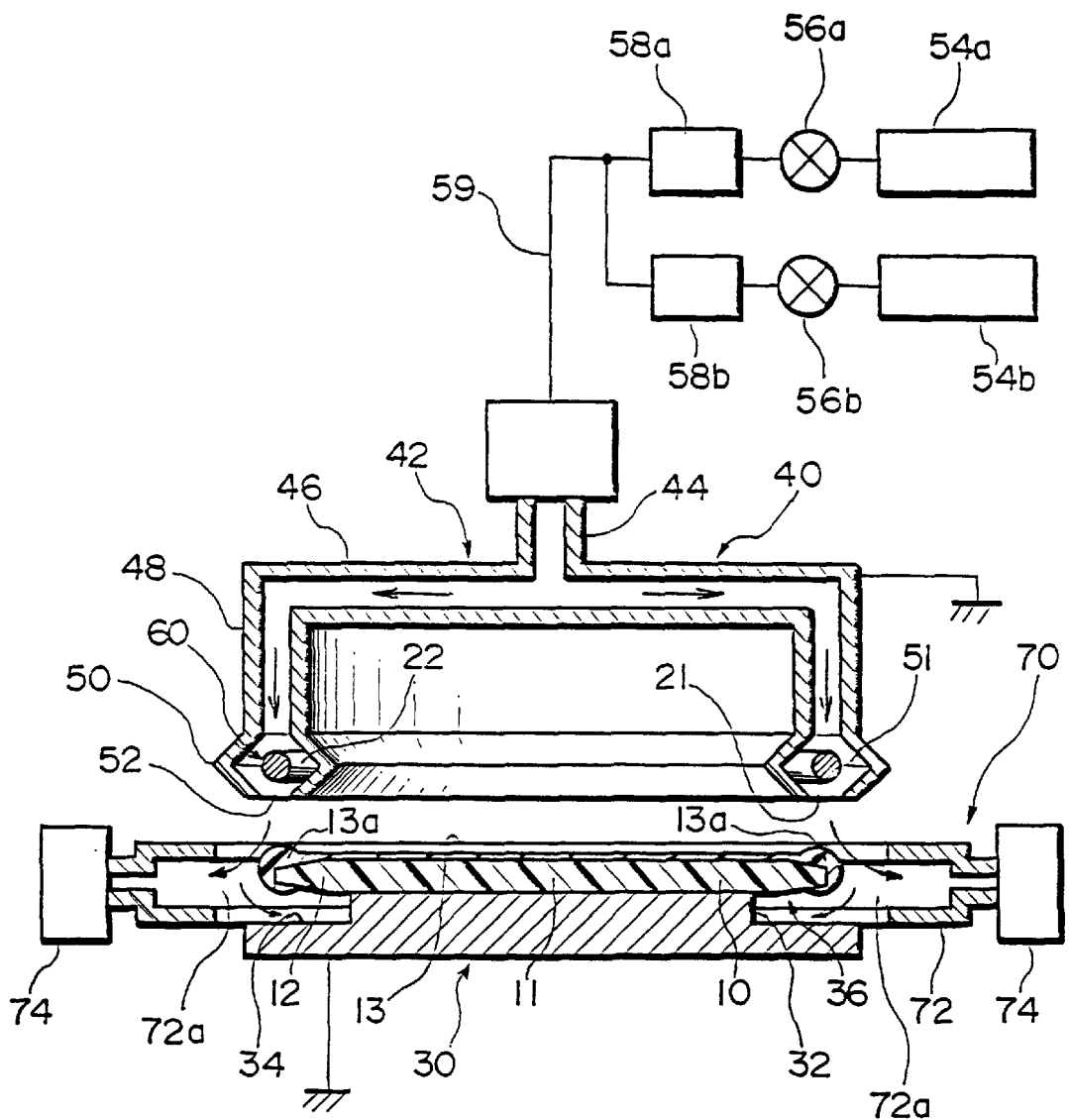
FIG. 1 is a schematic elevational sectional view of the removing device in accordance with an embodiment of the present invention.

As shown in FIG. 1, the removing apparatus of the present invention generally comprises a stage 30 for supporting silicon wafer 10, a gas supply 40 for supplying a gas capable of discharge directly to edge portion 12 of silicon wafer 10, and an exhaust 70 for exhausting the gas, the activated species formed by discharge, and the removed unnecessary matter coating material from reaction with the activated species.

Stage 30 includes a placement section 32 for holding the underside of middle area 11 of silicon wafer 10 under vacuum or the like. Stage 30 also includes a flange 34 formed in placement section 32 on the side thereof opposite to the placement side i.e., away from wafer 10. Flange 34 has an external diameter substantially equal to or larger than that of silicon wafer 10 and will not contact wafer 10 since a space 36 is formed therebetween.

Stage 30 may be formed of an electrically conductive material and connected to the ground, as shown in FIG. 1. Thus, stage 30 itself can be used as a ground electrode member in a pair of plasma generating electrodes. It is preferable that only flange 34 opposed to the underside of edge portion 12 of silicon wafer 10 is formed of an electrically conductive material while placement section 32 is formed of an insulating material. This is because no plasma should be generated over middle area 11 of silicon wafer 10 and SOG film 13 on middle area 11 should not be etched.

Gas supply 40 includes a gas supply passage 42 shown in FIG. 1. Gas supply passage section 42 usually includes a vertical passage 44, a horizontal passage 46, and vertical passage 48, which is in part annular and in part linear to correspond to the shape of the periphery of wafer 10, and which terminates in a ring-shaped (as viewed in vertical cross-section) passage 50. Vertical passage 44 is centrally formed in the top of gas supply passage 42, the bottom end of vertical passage 44 communicating with horizontal passage 46 which extends in the radial and outward direction therefrom. The outer end of horizontal passage 46 communicates with vertical passage 48, the lower end of vertical passage 48 being then connected to ring-shaped passage 50.

Vertical passage 48 and ring-shaped passage 50 are configured to form a contour corresponding to circular section 12a and flat portion 12b in edge portion 12 of silicon wafer 10. The lower end of ring-shaped passage 50 includes a gas outlet 52 formed therethrough to be continuous in the circumferential direction. Thus, gas outlet 52 will be located directly opposite to edge portion 12 of silicon wafer 10.

In this embodiment, activated gas supply 40 incudes gas cylinders 54a, 54b for supplying two types of gases to gas supply passage 42. Gas cylinder 54a contains, for example, a gas capable of atmospheric plasma discharge such as helium (He) while gas cylinder 54b contains a desired reactive gas such as, for example, tetrafluoromethane ($CF_4$), which may be used as an etching gas. Gas cylinders 54a and 54b are connected to vertical passage 44 of gas supply passage 42 through valves 56a and 56b, mass-flow controllers 58a and 58b and a gas introducing pipe 59.

Figure 5:
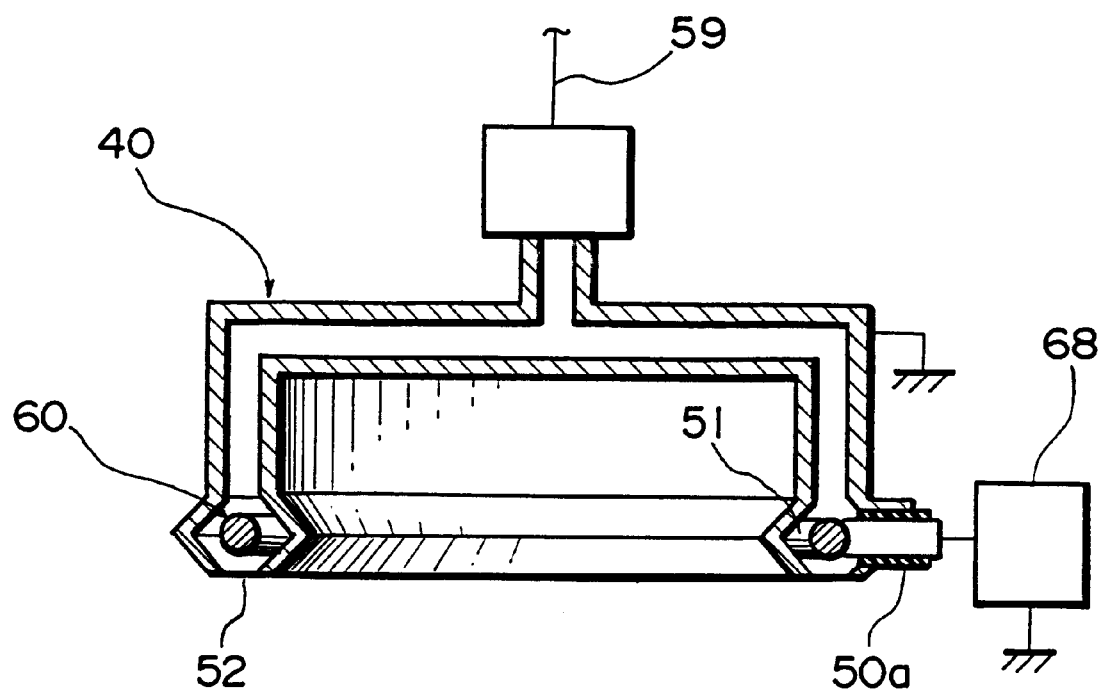
FIG. 5 is another elevational sectional view of the activated gas supply shown in FIG. 1.
Figure 6:
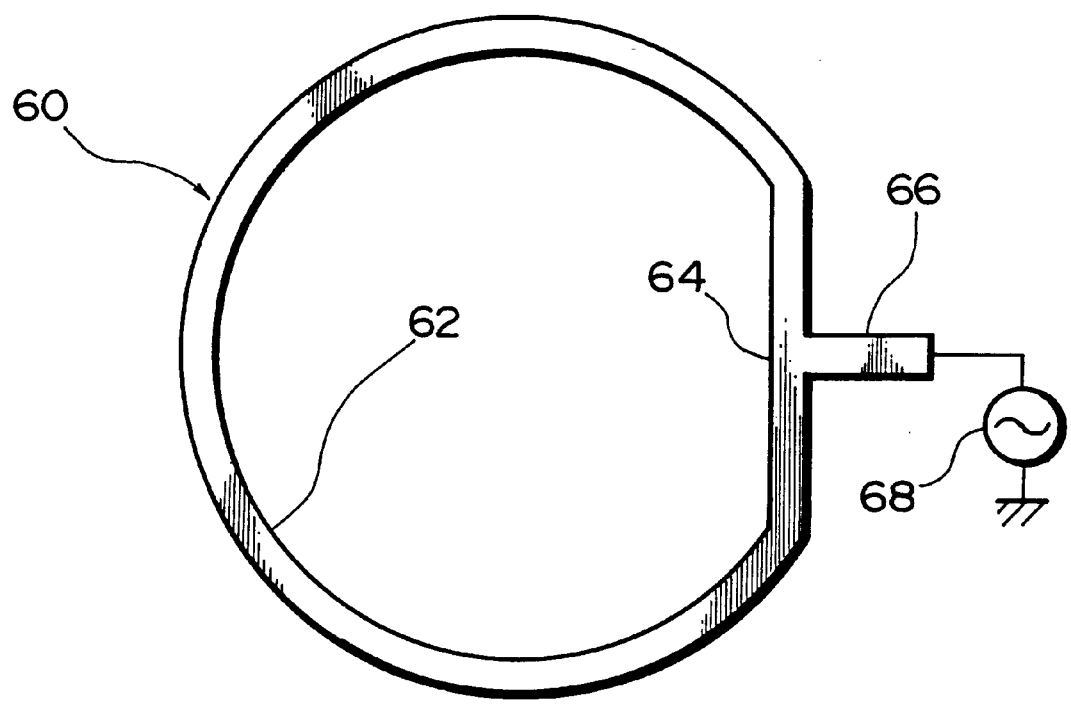
FIG. 6 is a plan view of a ring-shaped electrode which is mounted in the activated gas supply device shown in FIG. 1.

The interior of ring-shaped passage 50 includes a ring-shaped electrode 60 disposed therein, as shown in FIGS. 1 and 5. As shown in FIG. 6, ring-shaped electrode 60 has an annular portion 62 having a configuration corresponding to circular portion 12a of silicon wafer 10 and a linear portion 64 having a configuration corresponding to flat portion 12b of silicon wafer 10. Ring-shaped electrode 60 also has a connecting portion 66 which may outwardly extend from linear portion 64 through an insulation pipe 50a formed in ring-shaped passage 50 to connect to a power supply thereto outside of gas supply 40.

In this embodiment, connecting portion 66 of ring-shaped electrode 60 may be connected to power supply 62, which may be a high-frequency power source for supplying a high-frequency power, at 13.56 MHZ, for example. On the other hand, gas supply passage 42 is grounded. Therefore, gas supply passage 42 functions as a cover electrode which, together with ring-shaped electrode 60, forms a pair of plasma generating electrodes.

Exhaust 70 includes a hollow ring-shaped exhaust nozzle 72 configured and positioned to surround silicon wafer 10 at edge portion 12 supported on stage 30, as shown in FIG. 1. Exhaust nozzle 72 includes an exhaust port 72a formed therein, exhaust port 72a being connected to an exhaust duct 74 which is in turn connected to an air intake device (not shown).

Now removal of the rim portion 13a of the coating will be described. In an apparatus of the first embodiment, silicon wafer 10 is placed on stage 30 and held in place by vacuum pressure or the like. Stage 30 has typically been moved downwardly from the position shown in FIG. 1 and located at a position wherein stage 30 is separated from exhaust nozzle 72 of exhaust 70. When silicon wafer 10 is placed on stage 30 at this position, flat portion 12b of silicon wafer 10 is usually aligned in a particular direction so as to be oriented with respect to the shape of gas outlet 52 and exhaust 70.

Thereafter, stage 30 is upwardly moved to the position shown in FIG. 1. At this time, flat portion 12b of silicon wafer 10 is positioned opposite to flat portion 64 of ring-shaped electrode 60 (see FIG. 6).

Valve 56a connected to gas cylinder 54a is then opened to supply helium (He) gas, which is a gas capable of discharge to gas supply passage 42 of gas supply 40 while being controlled to supply a given flow rate by using mass-flow controller 58a. The supplied gas passes through passages 44, 46, 48 and 50 defining gas supply passage 42 and is blown out toward edge portion 12 of silicon wafer 10 through gas outlet 52. Stage 30 is maintained in this position. As a result, the ambient atmosphere within gas supply passage 42 and around edge portion 12 of silicon wafer 10 is displaced by helium gas.

A high-frequency voltage is then applied from high-frequency power source 68 to ring-shaped electrode 60. Thus, a plasma is generated and causes the gas to be excited and form activated species between ring-shaped electrode 60 and ring-shaped passage 50 connected to the ground, at or about atmospheric pressure. The inventors have confirmed that a thin blue-colored discharge phenomenon was produced in the interior of ring-shaped passage portion 50, which was considered to be a glow discharge.

While continuing to supply helium gas, valve 56b connected to gas cylinder 54b is opened. Thus, for example, tetrafluoromethane ($CF_4$) gas, which is a reactive gas, is supplied into gas supply passage 42 while being controlled to supply a given flow rate by mass-flow controller 58b. Thus, tetrafluoromethane gas is mixed with helium gas. The inventors have confirmed that the discharge generated had an orange color. At this time, various reactions in the gas, such as dissociation, ionization and excitation of the gas due to the plasma generation will be created within discharge chamber 51 in ring-shaped passage 50. As a result, an activated gas including fluorine ions, excited He and $CF_4$ molecules, generally called activated species will blow against edge portion 12 of silicon wafer 10 through gas outlet 52. The activated species then reacts with the material on raised rim portion 13a of the SOG film formed on edge portion 12. The activated species and raised rim portion 13a are decomposed into carbon monoxide, carbon dioxide and tetrafluorosilicon, as shown by the following chemical formula:

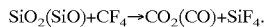
$SiO_2(SiO)+CF_4 \rightarrow CO_2(CO)+SiF_4$.

As shown by the above chemical formula, raised rim portion 13a of SOG film 13 existing on edge portion 12 of silicon wafer 10 can be removed from the substrate through etching. Then, the activated species, and removed unnecessary matter are exhausted through exhaust 70.

In this embodiment, space 36 exists between the underside of edge portion 12 of silicon wafer 10 and flange 34 of stage 30. The activated species will thus also flow into space 36. Since the activated species more or less move around the underside of edge portion 12 of silicon wafer 10 when the activated species passes through, both the top and under surfaces of edge portion 12 of silicon wafer 10 can be etched by the activated species to remove the unnecessary matter therefrom.

As a result, treated silicon wafer 10 will only have a substantially uniform SOG film 13 remaining at middle area 11 thereof after the step of removing the unnecessary SOG film portions from the top, bottom and side surfaces of edge portion 12 of silicon wafer 10, as shown in FIG. 3.

In this embodiment, activated species are blown out at a predetermined flow velocity through gas outlet 52 that has its configuration corresponding to the contour of silicon wafer 10. The blown gas is brought into contact with only edge portion 12 of silicon wafer 10 and not middle portion 11. The activated species and removed unnecessary matter are then exhausted from the area surrounding wafer 10 through exhaust 70. Therefor, the activated species will not contact middle area 11 of silicon wafer 10. According to the method of this embodiment, only raised rim portion 13a on edge portion 12 of silicon wafer 10 will be etched. SOG film 13 on middle area 11 that is required to form a desired film will not inadvertently be etched during the step of removing unwanted material in accordance with the present invention. When the method of the present invention is compared with the conventional masking process, in which middle area of silicon wafer 10 would be chucked, the present invention can prevent middle area 11 of silicon wafer 10 from being contaminated and damaged and thus, also protect various active elements and electrical components, including both passive and active elements on wafer 10.

According to the method of this embodiment, raised rim portion 13a having its thickness equal to 10 $\mu$m as described could be substantially removed in about one minute. The removing process of the present invention can be carried out in one step for an extremely short time and thus further reduce the manufacturing cost over previous methods since it does not require any vacuum pump or enclosed container for creating the plasma treatment gas.

Although the first embodiment of the present invention has been described as to the use of helium gas for generating the atmospheric plasma, any other inactive gas such as argon or other easy-ionizable gas capable of plasma discharge may be used in the present invention. A carrier gas for carrying the discharging and reacting gases, such as, for example, air or nitrogen, may also be used. This may further reduce the running costs because both air and nitrogen are less expensive than helium.

Although the first embodiment has been described as to the use of $CF_4$ gas as a reactive gas, any fluorine compound gas, such as, for example, fluorocarbon gas like $C_2F_6$ or $CHF_3$, or fluorine compound gas like $SF_6$, $NF_3$ or the like may be used for etching. By adding a little oxygen to these gases, the reaction rate may be increased further.

Although the first embodiment has been described as to the removal of SOG film 13, the present invention may also be applied to remove any organic SOG films, and further, other organic films such as polyamide films, resist films or the like.

If the present invention is to be applied to remove organic resists, such as photoresists used as patterning masks, or organic films, such as polyamide films used as final protective films and intermediate layers between wiring layers, oxygen ($O_2$) may be used directly as a reactive gas. In this case, an ashing process will occur as shown by the following formula:

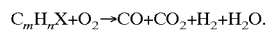
$C_mH_nX+O_2 \rightarrow CO+CO_2+H_2+H_2O$.

If the oxygen is mixed with a little fluorine gas or fluorine compound gas, the reaction rate may also be further increased and an improvement treatment rate may occur.

The reason why it is useful to mix oxygen gas with the fluorocarbon gas may be shown as follows: In some cases, the SOG film may contain carbon, as, for example, in organic SOG films. In some cases, an inorganic SOG film may contain residual carbon. In this case, the use of only a fluorocarbon gas may cause a CF polymer to deposit on the wafer or in the removing device. Hence, oxygen is added to promote decomposition by oxidation. If a resist or polyamide is used, for example, the reaction rate may be increased by adding a little $CF_4$ or $CHF_3$ into the oxygen used, resulting in an improvement of the etching rate.

The present invention is also not limited to use of the above gases, but may be used with any appropriate gas depending on the material to be removed and the etching rate or cost Although the first embodiment has been described as to the use of a cover electrode formed by the walls of gas supply passage 42, the present invention may also be applied to any other form of ground electrode. In this case, the cover forming gas supply passage 42, as shown in FIG. 1, may be formed of any non-conductive material other than metals, and may be, for example, made from ceramics.

As described, flange 34 of stage 30 may also be used as the opposite, or ground electrode. In such a case, plasma may be generated in the gap between flange 34 and ring-shaped electrode 60. Edge portion 12 of silicon wafer 10 may thus be exposed directly to the plasma. It is, however, negligible that edge portion 12 will be damaged by the plasma since edge portion 12 does not have active elements or electrical components contained thereon. Middle area 11 has active elements and electrical components thereon, but placement section 32 which is holding the underside of middle area 11 is formed of an insulation material, thus no plasma will be generated over middle area 11.

Figure 7:
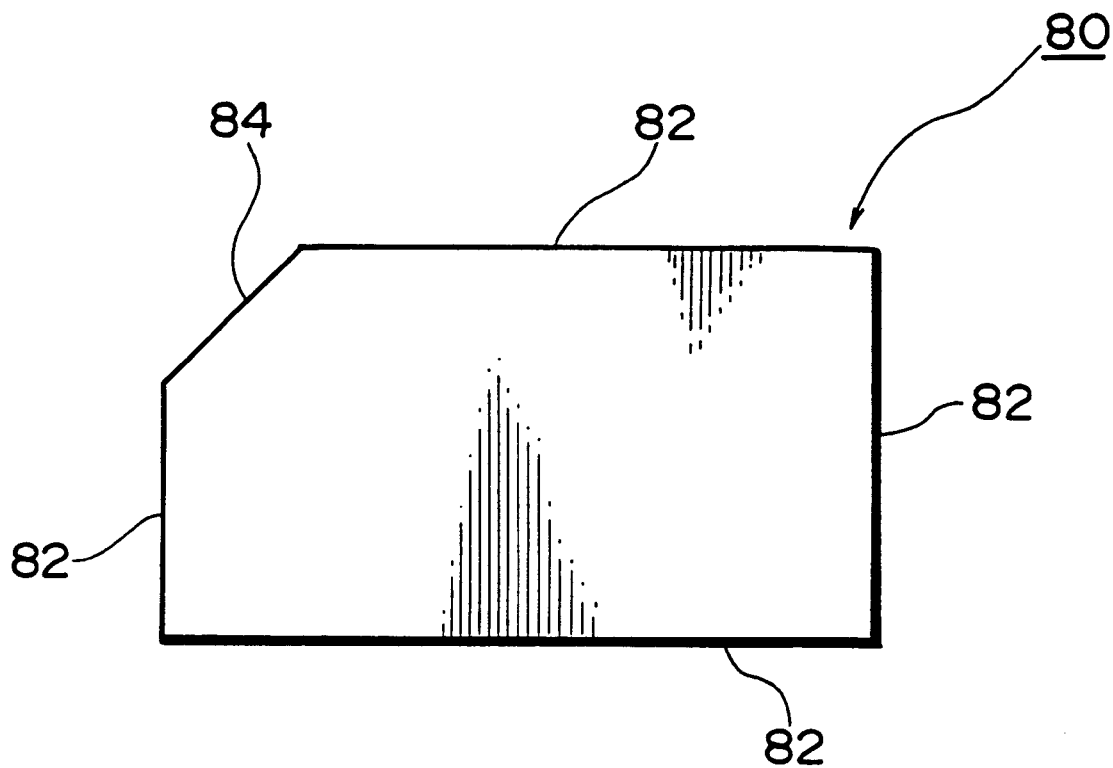
FIG. 7 is a plan view of a liquid crystal display (LCD) substrate.
Figure 8:
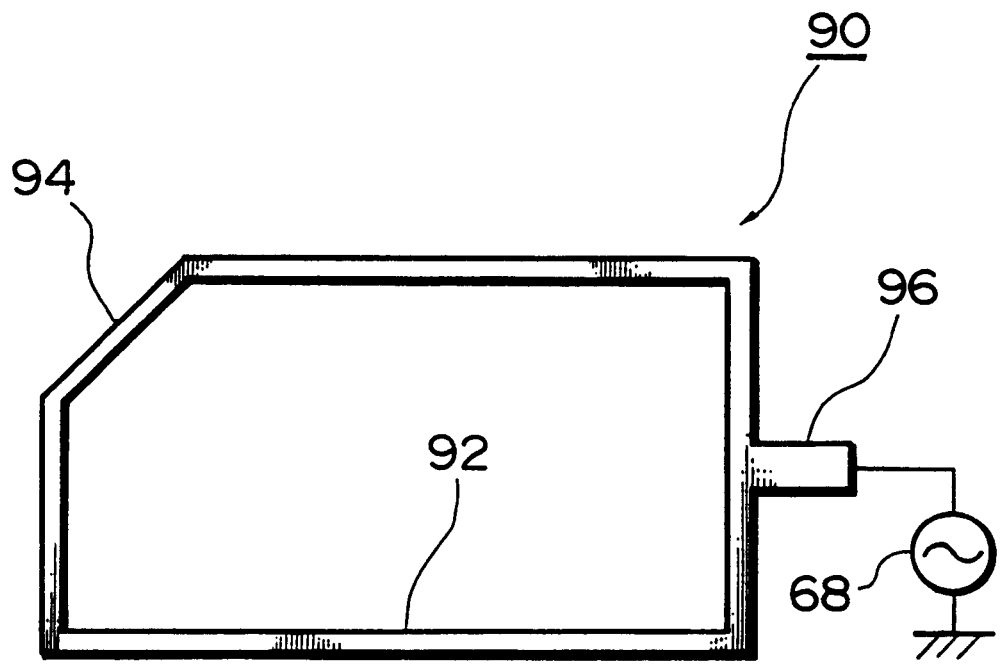
FIG. 8 is a plan view of a five-cornered electrode used to remove unnecessary matter from the edge of the LCD substrate in accordance with the present invention.

The method according to the first embodiment may also be applied to rectangular-shaped substrates or other workpieces as shown in FIG. 7 (e.g., liquid-crystal display (LCD) substrate 80) in the following manner. LCD substrate 80 has a rectangular edge portion 82 and a positioning flat portion 84 formed by chamfering one corner in rectangular edge portion 82. In order to remove coating on the edge portion of LCD substrate 80, ring-shaped electrode 60 of FIG. 1 may be replaced by a five-cornered electrode 90 as shown in FIG. 8. Five-cornered electrode 90 has a rectangular portion 92 positioned opposite to rectangular edge portion 82 of LCD substrate 80 and a flat portion 94 formed at a position corresponding to flat portion 84 of LCD substrate 80. Five-cornered electrode 90 also includes a connecting portion 96 outwardly extending from one side of rectangular portion 92. Connecting portion 96 further extends to an outside connection through an insulation pipe (not shown) as is the case with the embodiment described with reference to FIG. 1, where an insulation pipe 50a in ring-shaped passage 50 provides passage to the outside connection. To house five-cornered electrode 90, ring-shaped passage 50 and vertical passage 48 shown in FIG. 1 may be changed in configuration to correspond to the shape of five-cornered electrode 90.

When LCD substrate 80 is to be treated, various types of coating films such as resist or the like, as in silicon wafer 10, are formed. Such films on the edge portion can be removed in a similar manner. Alternatively, transparent acrylic thermal polymerization type organic resists, formed as color filter protection films, may also be removed from the edge portion.

Figure 9:
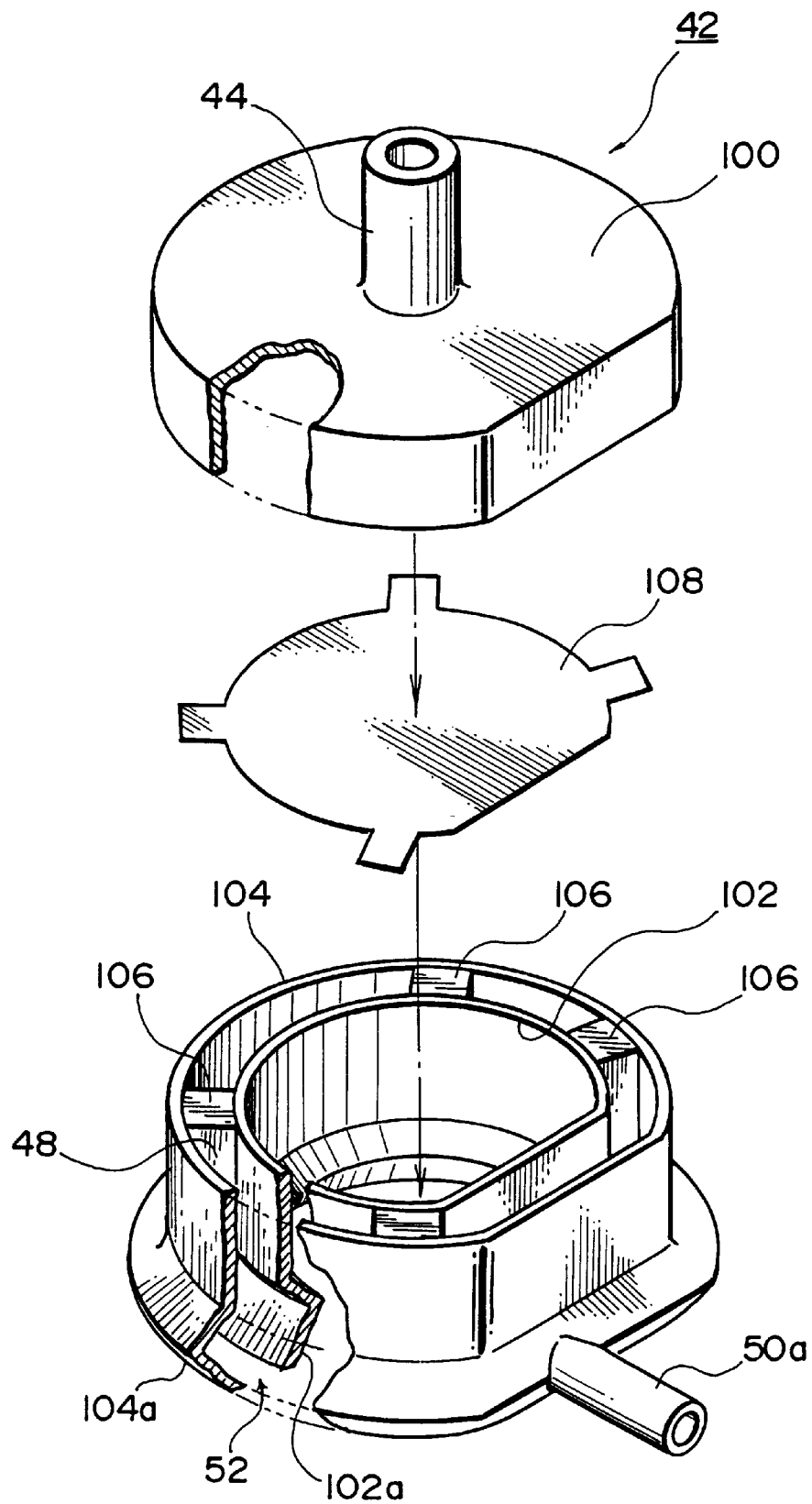
FIG. 9 is an exploded, perspective view of the activated gas supply shown in FIG. 1.

A structure for facilitating the assembly of gas supply passage section 42 in activated gas supply 40 will now be described with reference to FIG. 9. Gas supply passage 42 includes a top cover 100, an inner cylindrical wall 102, an outer cylindrical wall 104, intermediate support members 106 and a shield plate 108. Top cover 100 is centrally connected to vertical passage 44. The lower end of each of inner cylindrical and outer cylindrical wall 104 includes a curved portion 102a or 104a.

On assembling gas supply passage 42, ring-shaped electrode 60 is first disposed within curved portion 104a of outer cylindrical wall 104. Connecting portion 66 of ring-shaped electrode 60 extends outwardly through insulation pipe 50a to make external connections with a power supply (not shown). Thereafter, inner cylindrical wall 102 is disposed inside of outer cylindrical wall 104 through intermediate support members 106. Shield plate 108 is located on the top ends of intermediate support members 106 and inner cylindrical wall 102 to shield the internal passage in inner cylindrical wall 102. Top cover 100 is further fixedly mounted on shield plate 108. In this manner, gas supply passage 42, as shown in FIG. 1, may be constructed.

As seen from FIG. 1, horizontal passage 46 is formed between the inside of top cover 100 and shield plate 108. Annular vertical passage 48 is formed between inner cylindrical wall 102 and outer cylindrical wall 104. Ring-shaped passage 50 of FIG. 1 is formed between curved portion 102a of inner cylindrical wall 102 and curved portion 104a of outer cylindrical wall 104. A circular slit is formed between curved portion 102a of inner cylindrical wall 102 and curved portion 104a of outer cylindrical wall 104. The circular slit serves as gas outlet 52 shown in FIG. 1.

Figure 10:
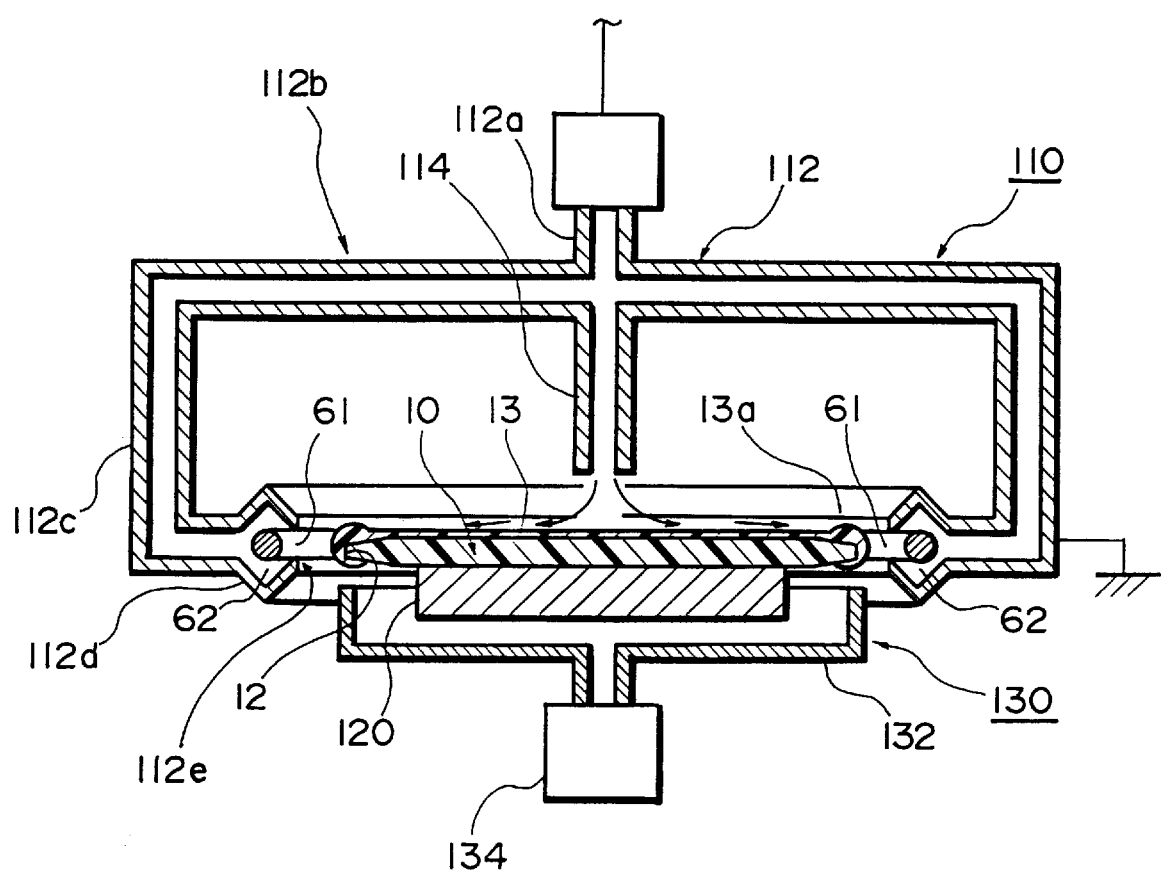
FIG. 10 is a schematic elevational sectional view of a removing device in accordance with a second embodiment of the present invention.

Referring now to FIG. 10, a second embodiment of the present invention is shown. The second embodiment provides a removing apparatus for removing unnecessary matter which generally includes a gas supply 110, a stage 120 and an exhaust 130, as in the first embodiment. Gas supply 110 has a gas supply passage 112 that functions as a cover electrode when it is grounded. Gas supply passage 112 comprises a vertical passage 112a, a horizontal passage 112b, an annular vertical passage 112c, a ring-shaped passage 112d and gas outlet 112e disposed around silicon wafer 10 placed on stage 120. Therefore, a ring-shaped electrode 61, which is received within ring-shaped passage 112d, has a larger diameter than that of ring-shaped electrode 60 of the first embodiment described with reference to FIG. 1, but has a configuration similar to that of ring-shaped electrode 60.

Stage 120 includes a placement section on which silicon wafer 10 is placed. The placement section contacts the underside of silicon wafer 10 at the middle portion thereof and not at edge portion 12.

Exhaust 130 includes a dish-shaped exhaust guide wall 132 disposed below silicon wafer 10 and stage 120. The activated species and removed coating material are externally exhausted through a space between exhaust guide wall 132 and the bottom faces of edge portion 12 and stage 120, through an exhaust duct 134. The second embodiment is similar to the first embodiment in that the activated species are blown against edge portion 12 of silicon wafer 10 to remove raised rim portion 13a of SOG film 13 therefrom. However, the second embodiment is different from the first embodiment in that gas outlet 112e is so disposed as to blow activated species inwardly against silicon wafer 10. The activated species blown against silicon wafer 10 can remove any unnecessary SOG film matter from the top, bottom and side faces of edge portion 12 of silicon wafer 10.

In the second embodiment, there is a higher probability than in the first embodiment that the activated gas and removed coating material will move onto middle area 11 of silicon wafer 10 and contaminate it. Therefore, activated gas supply device 110 of the second embodiment includes a carrier (unactivated) gas supply pipe 114. Carrier gas supply pipe 114 is formed so as to extend downwardly and coaxially with vertical passage 112a and connected to horizontal passage 112b. The lower open end of carrier gas supply pipe 114 is positioned above silicon wafer 10 at or near the center thereof.

In the second embodiment, various types of gases capable of discharge, or reaction gases introduced through vertical passage 112a are conducted into a discharge chamber within ring-shaped passage 112d through horizontal passage 112b and annular vertical passage 112c, the gases being then activated in the same manner as in the first embodiment. On the other hand, various types of gases introduced from vertical passage 112a directly into carrier gas supply pipe 114 are blown directly against the center of silicon wafer 10 without being excited by the plasma. The unactivated gas functions as a carrier gas for carrying the activated gas and removed unnecessary matter toward the exhaust 130 and away from middle area 11. The carrier gas flows radially from the center of silicon wafer 10 toward exhaust 130 disposed below silicon wafer 10, through which the carrier gas is externally exhausted. The carrier gas can thus prevent the activated gas from moving to middle area 11 of silicon wafer 10. Thus, SOG film 13 on middle area 11 of silicon wafer 10 can be prevented from being removed therefrom by the removing method and apparatus of the present invention.

Figure 11:
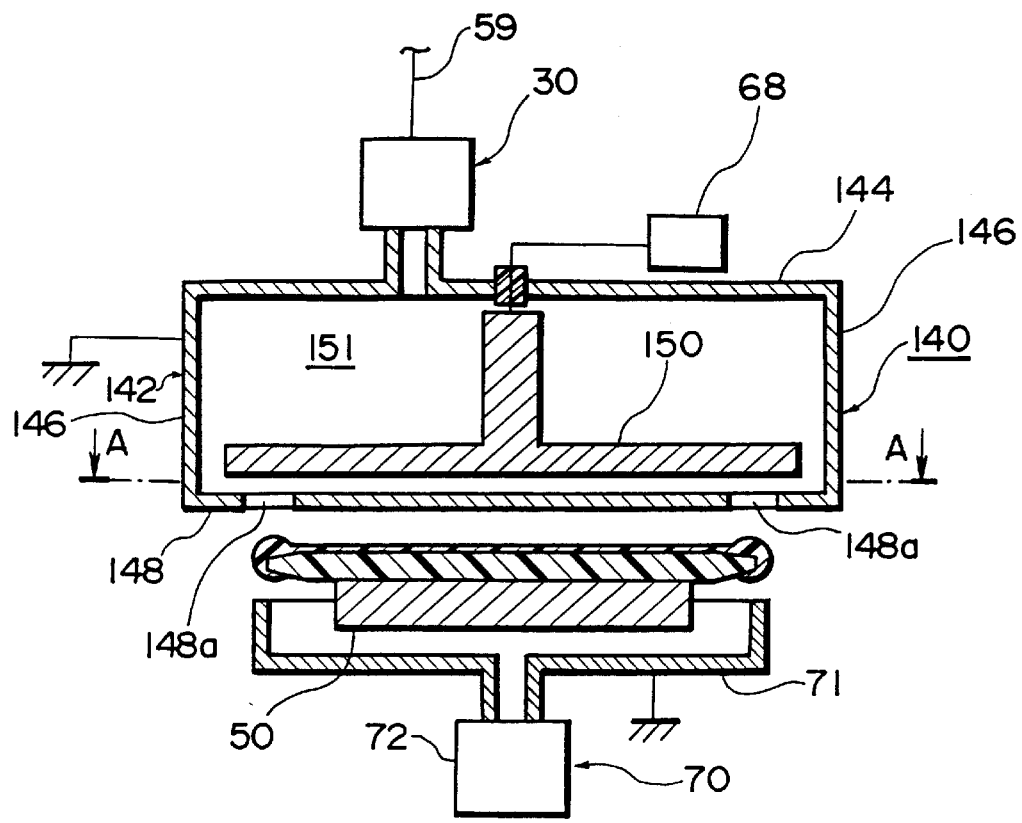
FIG. 11 is a schematic elevational sectional view of a removing device in accordance with a third embodiment of the present invention.

Referring now to FIG. 11, there is shown a third embodiment of the present invention which is different from the second embodiment in that activated gas supply 110 of the second embodiment is replaced by activated gas supply 140 as shown in FIG. 11.

Figure 12:
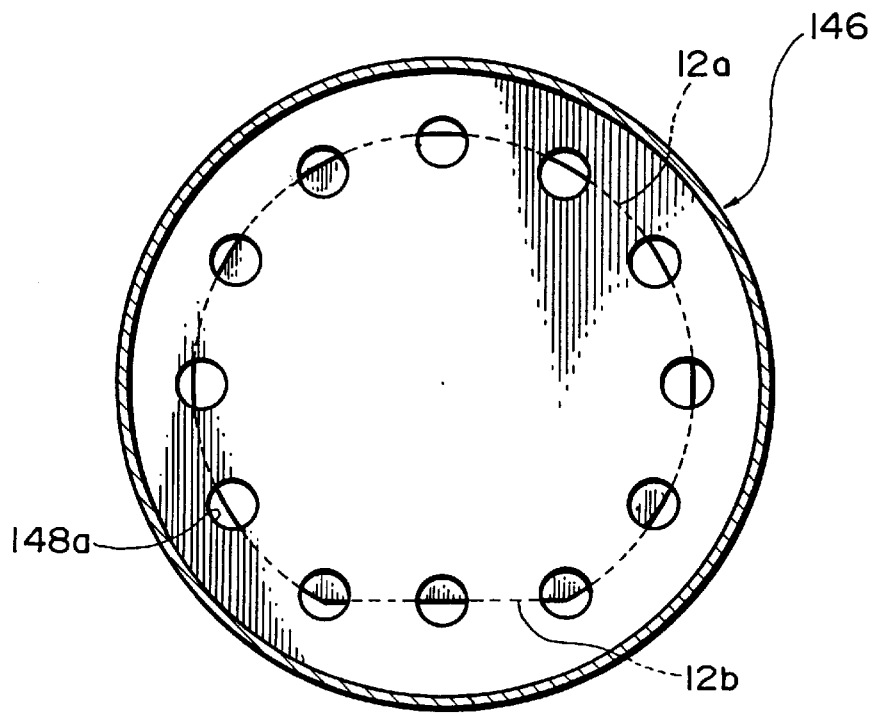
FIG. 12 is a schematic plan view illustrating the positional relationship between the gas outlet of the activated gas supply device shown in FIG. 11 and the edge portion of a wafer.

Activated as supply 140 comprises a cover electrode 142 formed by a top wall 144, side walls 146 and a bottom wall 148. Cover electrode 142 includes a plate electrode 150 disposed therein. Plate electrode 150 is connected to a high-frequency power source 68. Cover electrode 142 is grounded. These electrodes form a pair of plasma generating electrodes. As in the first embodiment, various types of gases capable of discharge will be introduced into the interior of cover electrode 142 which functions as a discharge chamber 151. As shown in FIG. 12, bottom wall 148 of cover electrode 142 includes a plurality of gas outlets 148a that are opposed to circular portion 12a and flat portion 12b of silicon wafer 10. In the third embodiment, a plasma is generated between plate electrode 150 and cover electrode 142 (and particularly its bottom wall 148) to activate the gas capable of discharge. The activated species are blown against edge portion 12 of silicon wafer 10 through gas outlets 148a on bottom wall 148. Gas outlets 148a may be formed into any suitable configuration and size disposed so as to correspond to the perimeter of silicon wafer 10 as shown in FIG. 12.

In the third embodiment, discharge chamber 151 may be formed into any suitable configuration so long as gas outlets 148a formed on bottom wall 148 correspond to edge portion 12 of silicon wafer 10.

Figure 13:
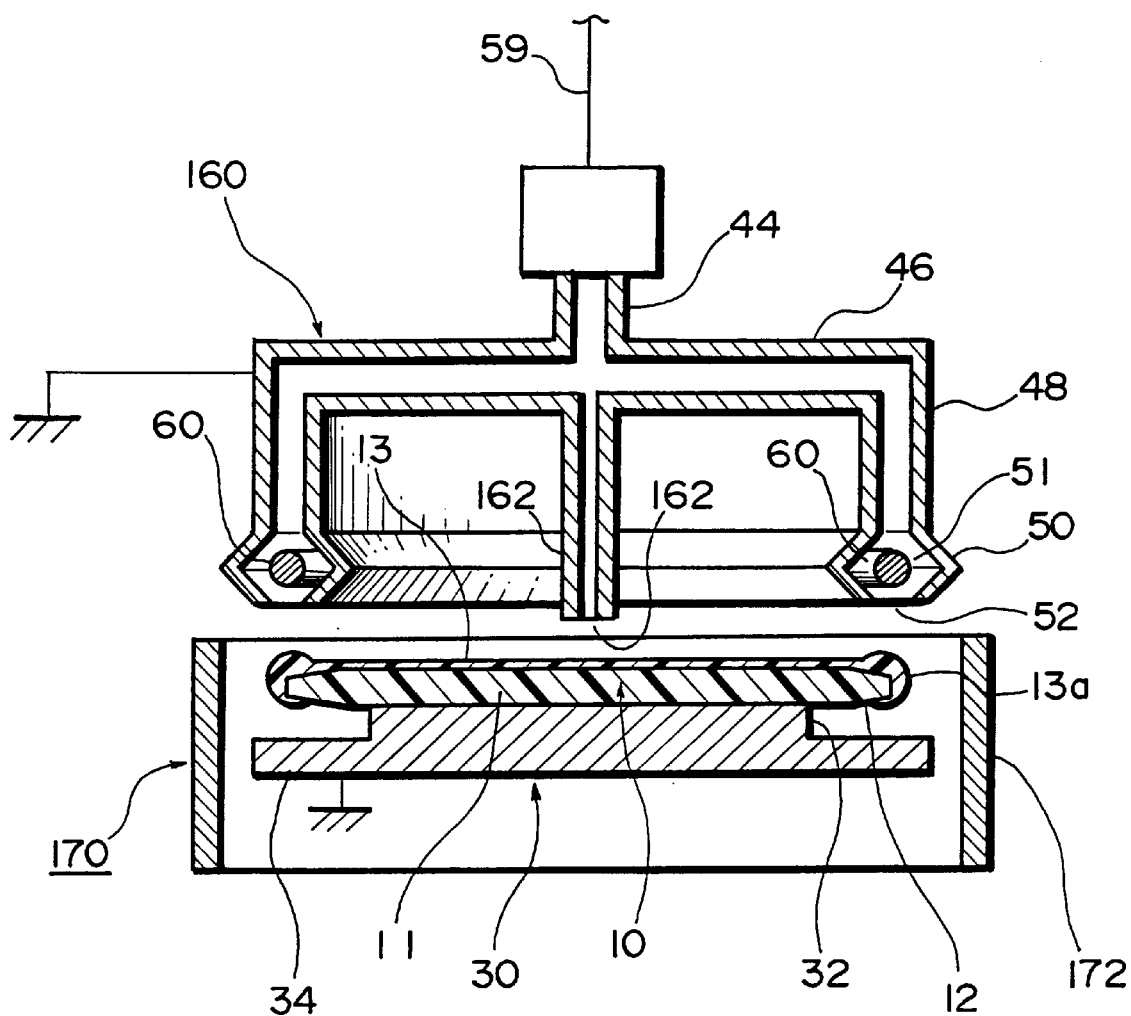
FIG. 13 is a schematic elevational sectional view of a removing device in accordance with a fourth embodiment of the present invention.

Referring now to FIG. 13, there is shown a fourth embodiment of the present invention which is formed by adding a part of the second embodiment to the first embodiment. In other words, the fourth embodiment is different from the first embodiment in that an activated gas supply 160 includes a carrier (unactivated) gas supply pipe 162 and in that the configuration of an exhaust 170 is different from that of exhaust 70 of the first embodiment.

Carrier gas supply pipe 162 in activated gas supply device 160 is formed to extend downwardly and coaxially with vertical passage 44 and connected to the horizontal passage 46. Carrier gas supply pipe 162 has a lower open end 162a, as in the second embodiment.

In the fourth embodiment, various types of gases capable of discharge introduced through vertical passage 44 are conducted into discharge chamber 51 within ring-shaped passage 50 through horizontal passage 46 and annular vertical passage 48, the gases being then activated in the same manner as in the first embodiment. On the other hand, various types of gases introduced from vertical passage 44 directly into carrier gas supply pipe 162 are blown against the center of silicon wafer 10 without being excited by the plasma. The unactivated gases function as a carrier gas as in the second embodiment. The carrier gas flows radially from the center of silicon wafer 10 toward the inner wall of a cylinder-shaped exhaust pipe 172 which is disposed to surround silicon wafer 10. The carrier gas is externally exhausted through the exhaust pipe 172 of the exhaust 170.

Exhaust 170 is not necessarily required to be of a suction type. Exhaust 170 may merely be a guide for conducting the exhaust gas since the carrier gas is fed through exhaust 170 under pressure. Exhaust 130 of the second embodiment may also be in the form of a guide for conducting the exhaust gas, rather than a gas exhaust using suction.

In order to prevent the activated gas from moving around to middle area 11 of silicon wafer 10, a pressurized gas different from the gas fed into discharge chamber 51 may be blown against the center of silicon wafer 10 through any other suitable means different from carrier gas pipe 162 of FIG. 13 connected to vertical passage 44. Such a pressurized gas may simply be compressed air. To improve the efficiency of exhausting, exhaust pipe 172 may have a forced gas exhaust function, i.e., suction, in addition to the exhaust guide function. This is true for the second embodiment as well.

Figure 15:
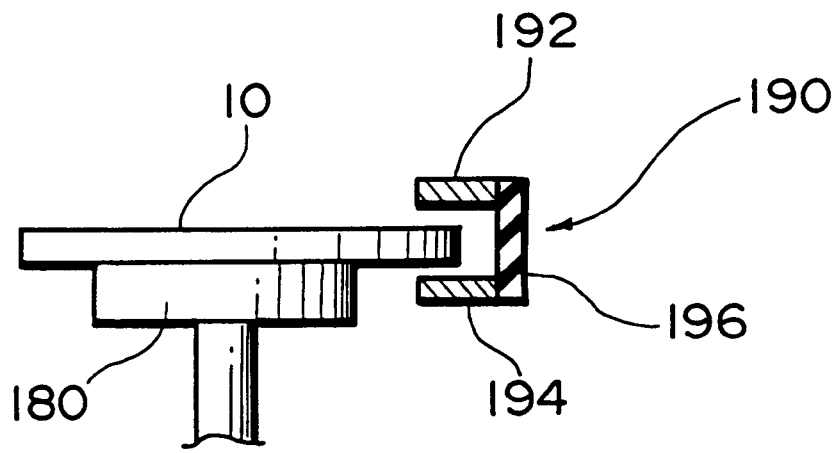
FIG. 15 is a schematic elevational sectional view of the removing device shown in FIG. 14.
Figure 16:
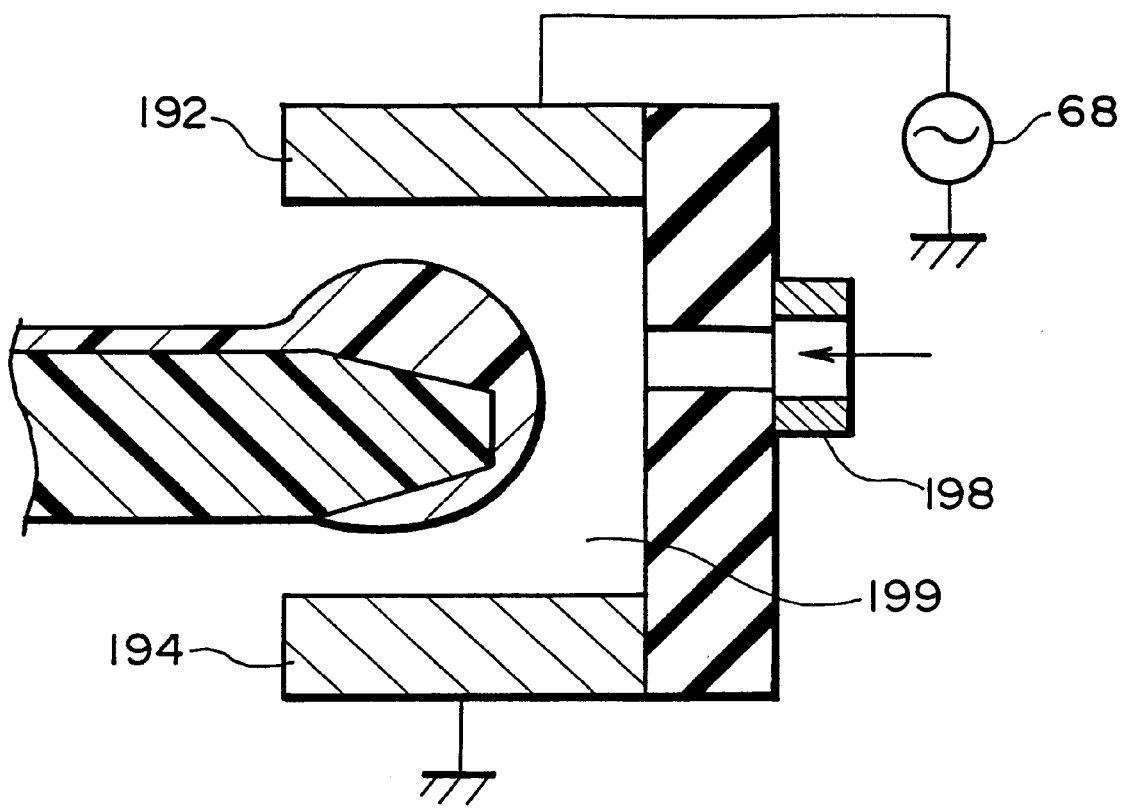
FIG. 16 is an enlarged vertical sectional view of plasma generating electrodes in the removing device shown in FIG. 14.

A further embodiment of the present invention in which raised rim portion 13a on edge portion 12 of silicon wafer 10 is removed while rotating silicon wafer 10 will be described with reference to FIGS. 14 to 17. Such a removing apparatus comprises a spin chuck 180 for rotating silicon wafer 10 in a direction as shown by an arrow 300 in FIG. 14. A plasma generating electrode section 190 is located at a point along edge portion 12 of rotating silicon wafer 10. As shown in FIG. 15, plasma generating electrode section 190 comprises a first electrode 192 located above edge portion 12, a second electrode 194 disposed opposite to first electrode 192 on the other side of edge portion 12, and an insulation connecting portion 196 connecting first electrode 192 and second electrode 194 to each other at the side of edge portion 12. As shown in FIG. 16, insulation connecting portion 196 is also connected to a gas introducing pipe 198 so that a gas capable of discharge can be introduced into a discharge chamber 199 formed between first electrode 192 and second electrode 194.

Figure 14:
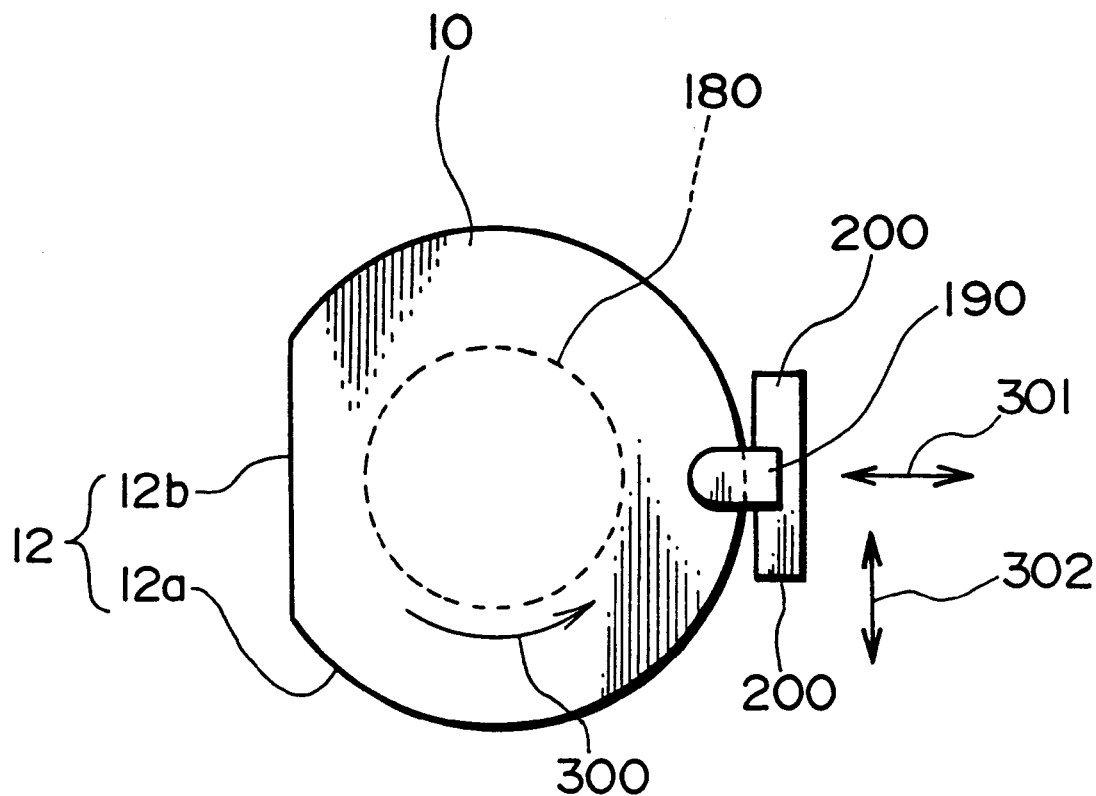
FIG. 14 is a plan view of a removing device in accordance with a fifth embodiment of the present invention.

As shown in FIG. 14, furthermore, exhausts 200 are located on opposite sides of plasma generating electrode 190. Plasma generating electrode 190 and exhausts 200 are movable in the direction as shown by arrows 301 and 302 in FIG. 14. Alternatively, spin chuck 180 may be movable in these directions.

In the fifth embodiment, silicon wafer 10 is rotated by spin chuck 180 so that the position of edge portion 12 relative to plasma generating electrode section 190 can be sequentially varied. In plasma generating electrode section 190, for example, first electrode 192 may be connected to a high-frequency power source 68 while second electrode 194 may be grounded. When a gas capable of discharge is introduced into discharge chamber 199 through gas introducing pipe 198, a plasma can locally be generated near edge portion 12 of silicon wafer 10. Activated species formed by the plasma can react with and remove raised rim portion 13a from edge portion 12 of silicon wafer 10. The removed coating material and activated species are exhausted through exhaust 200 on opposite sides of plasma generating electrode section 190. If exhausts 200 are positioned at any suitable height or if the activated species are exhausted through the bottom side of edge portion 12 of silicon wafer 10, the unnecessary coating material on the bottom face of silicon wafer 10 can also be removed.

Figure 17:
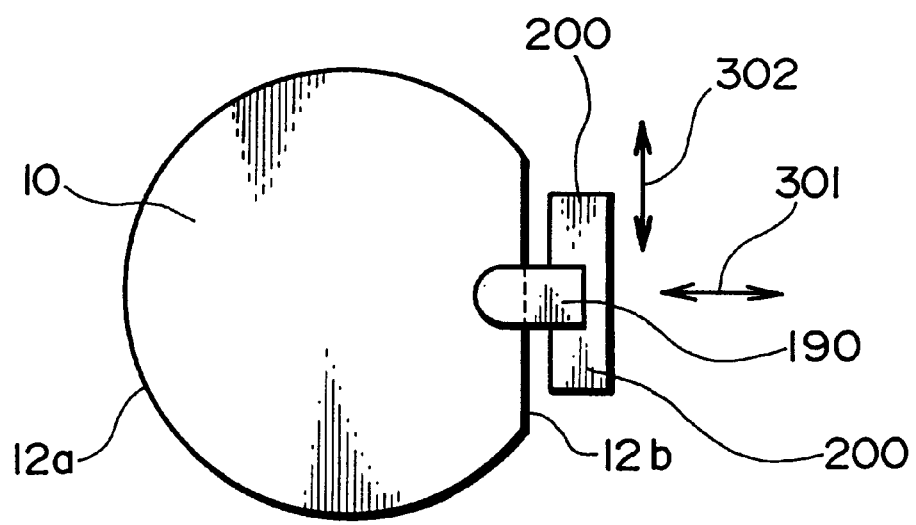
FIG. 17 is a schematic plan view illustrating a step of removing unnecessary matter from the flat portion of a wafer in accordance with the present invention.

To remove the coating material from flat portion 12b of silicon wafer 10, plasma generating electrode section 190 may be moved to a position as shown in FIG. 17 by movement in the direction of arrow 301. If plasma generating electrode section 190 is thereafter moved linearly by movement in the direction of arrow 302, all the area of flat portion 12b can be sequentially positioned between first electrode 192 and second electrode 194 for removal of unnecessary matter therefrom. In the fifth embodiment, the discharge area in plasma generating electrode section 190 can be smaller than those of the previous other embodiments.

Figure 18:
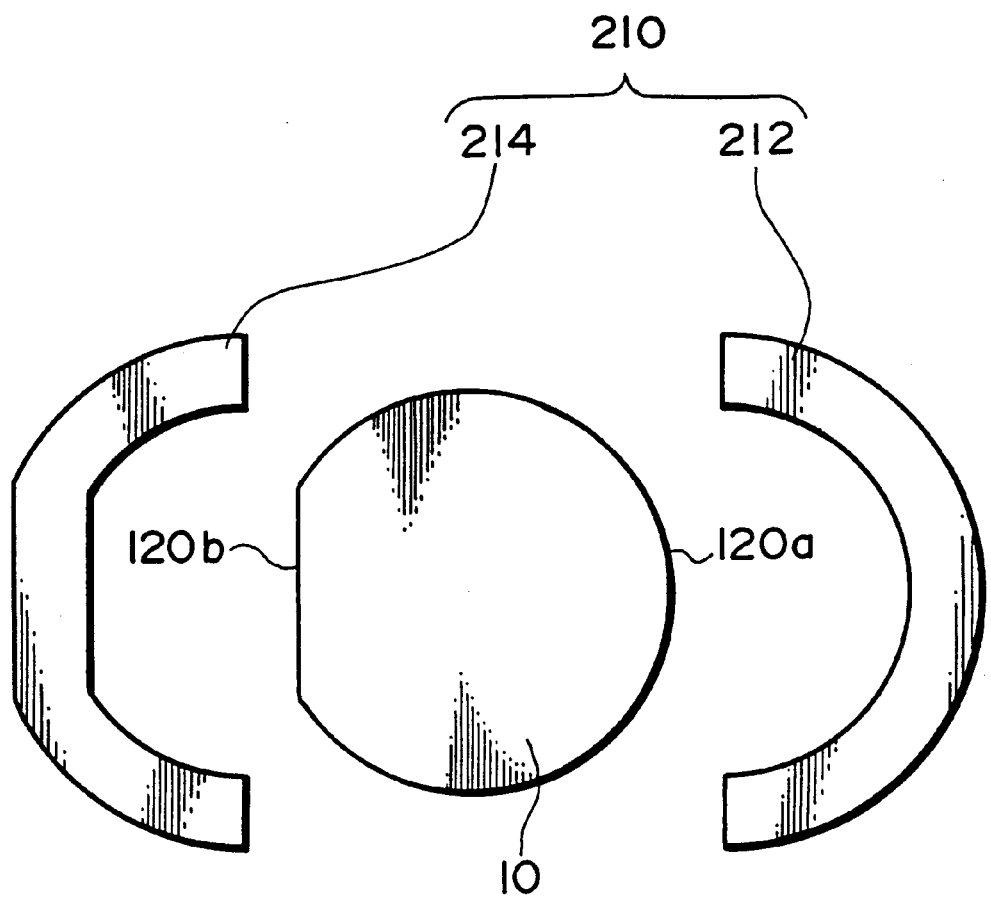
FIG. 18 is a plan view of a removing device in accordance with a sixth embodiment of the present invention.
Figure 19:
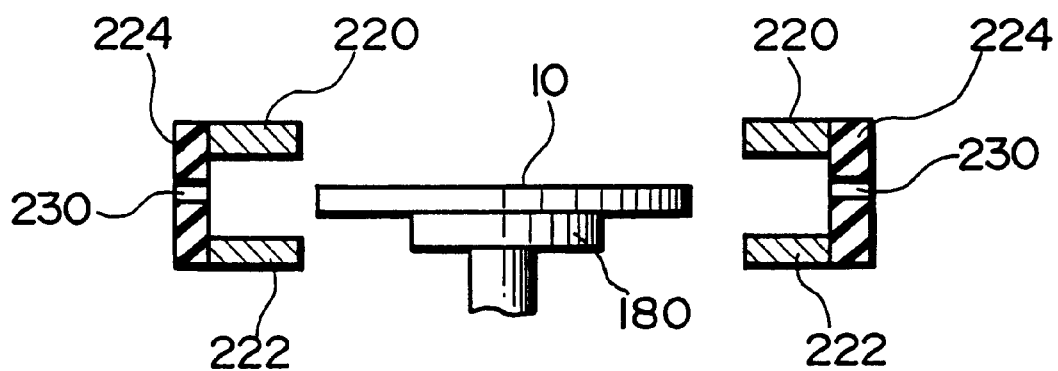
FIG. 19 is an elevational sectional view of the removing device shown in FIG. 18.
Figure 20:
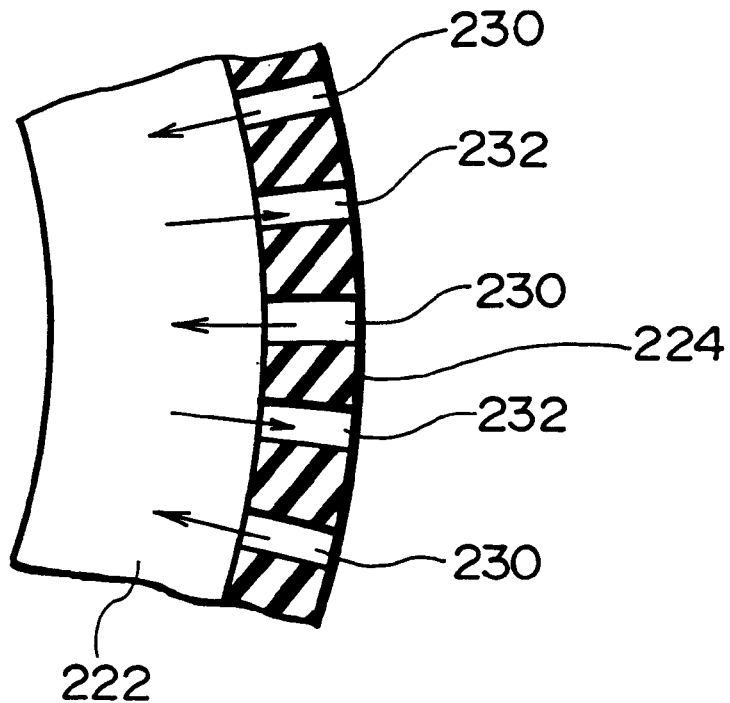
FIG. 20 is an enlarged partial sectional plan view of the plasma generating electrodes shown in FIG. 18.
Figure 21:
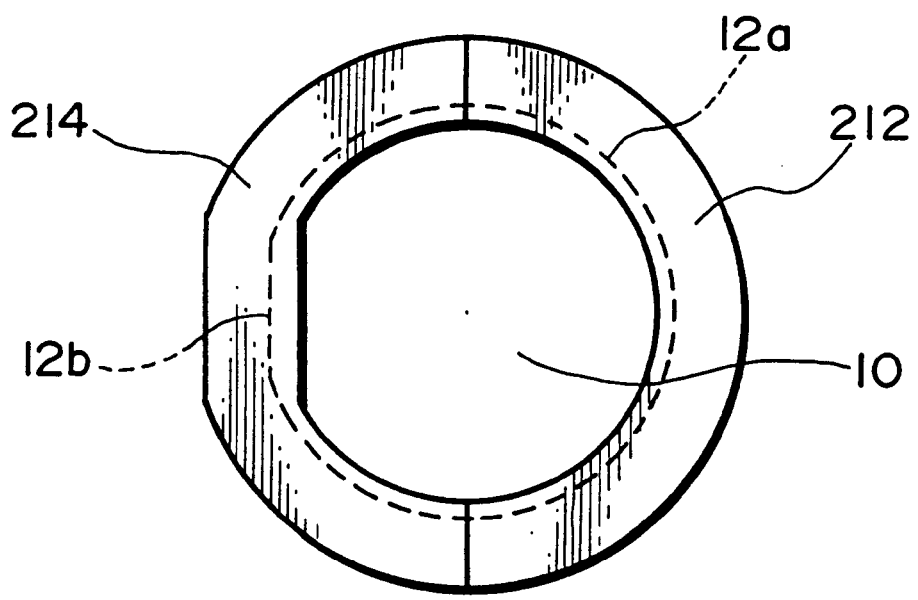
FIG. 21 is a schematic view illustrating a removing step in the removing device shown in FIG. 18.

A sixth embodiment of the present invention will be described with reference to FIGS. 18 to 21. In the sixth embodiment, a plasma generating electrode section 210 includes a first half-circumferential electrode 212 located opposite to one half-circumferential area of silicon wafer 10 and a second half-circumferential electrode 214 located opposed to the other half-circumferential area of silicon wafer 10 that includes flat portion 12b. As shown in FIG. 19, both first half-circumferential electrode 212 and second half-circumferential electrode 214 has a cross-section similar to that of plasma generating electrode section 190 described with reference to the fifth embodiment as shown in FIG. 15, and includes a first electrode 220, a second electrode 222 and an insulation connection portion 224 connecting first electrode 220 and second electrode 222 to each other. As shown in FIG. 20, insulation connection 224 includes gas introducing apertures 230 and gas exhaust apertures 232 which are alternately formed therethrough and spaced away from one another in the circumferential direction of insulation connection portion 224. In the sixth embodiment, first half-circumferential electrode 212 and second half-circumferential electrode 214 can be moved linearly relative to silicon wafer 10 from the position as shown in FIG. 18 so that the circumference of silicon wafer 10 consisting of circular portion 12a and flat portion 12b will align with first half-circumferential electrode 212 and second half-circumferential electrode 214, respectively, as shown in FIG. 21. Thereafter, a gas capable of discharge is introduced through gas introducing apertures 230 into a space formed in between first electrode 220 and second electrode 222. When a high-frequency voltage is applied across the first electrode 220 and second electrode 222, a plasma is generated in that space. Thus, unnecessary matter on raised rim portion 13a on edge portion 12 of silicon wafer 10 can be removed in a manner similar to the process as described in the previous embodiments. Alternatively, each half-circumferential area of silicon wafer 10 may be treated one at a time to remove the unnecessary material from the thick-walled coating portion thereon.

A further aspect of the present invention is adapted to perform coating and removing steps in an in-line manner by moving silicon wafer 10 between a coating device as shown in FIG. 4 and a removing device as described in connection with any of the embodiments herebefore described.

Figure 22:
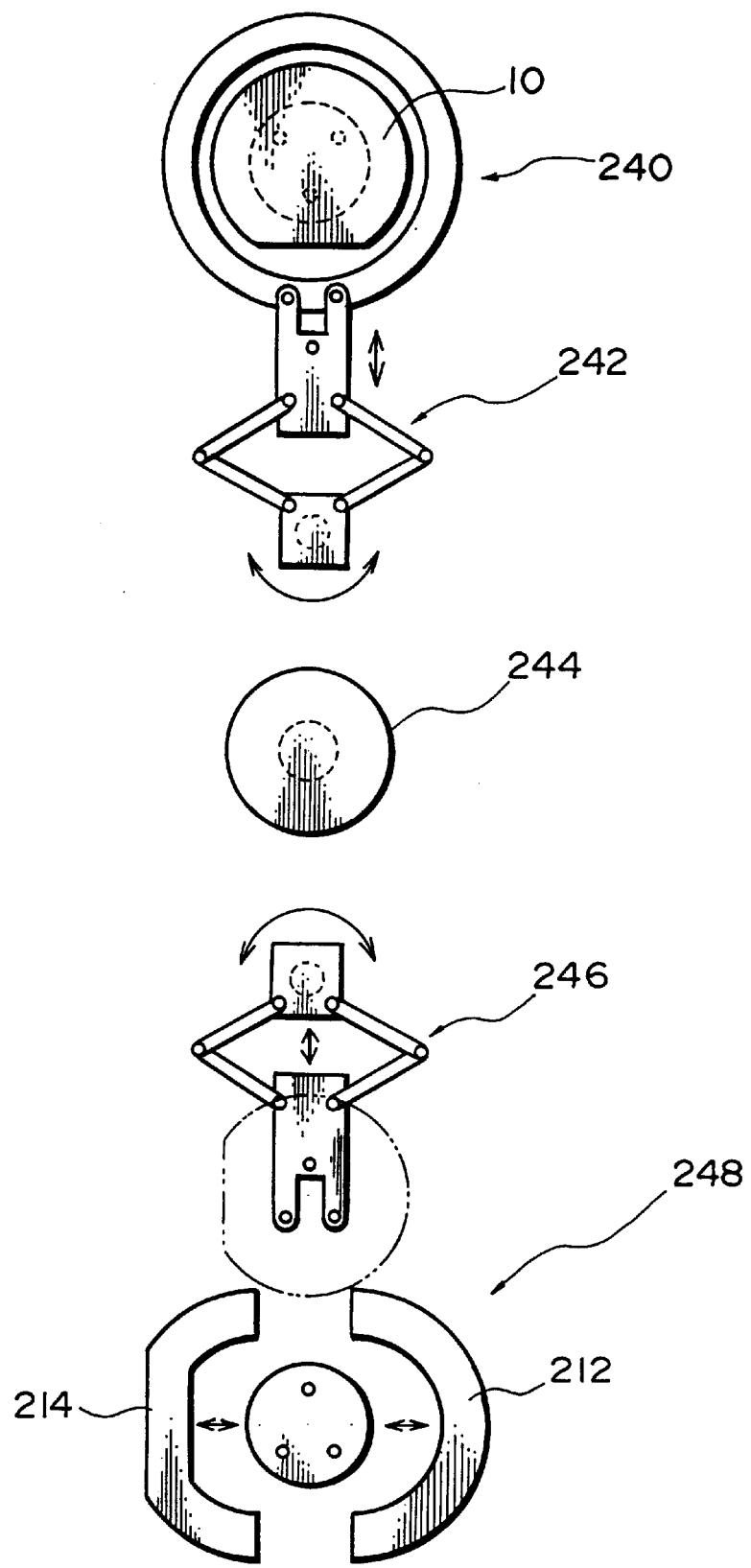
FIG. 22 is a plan view of an in-line system comprising a coating device and an unnecessary matter removing device in accordance with the present invention.
Figure 23:
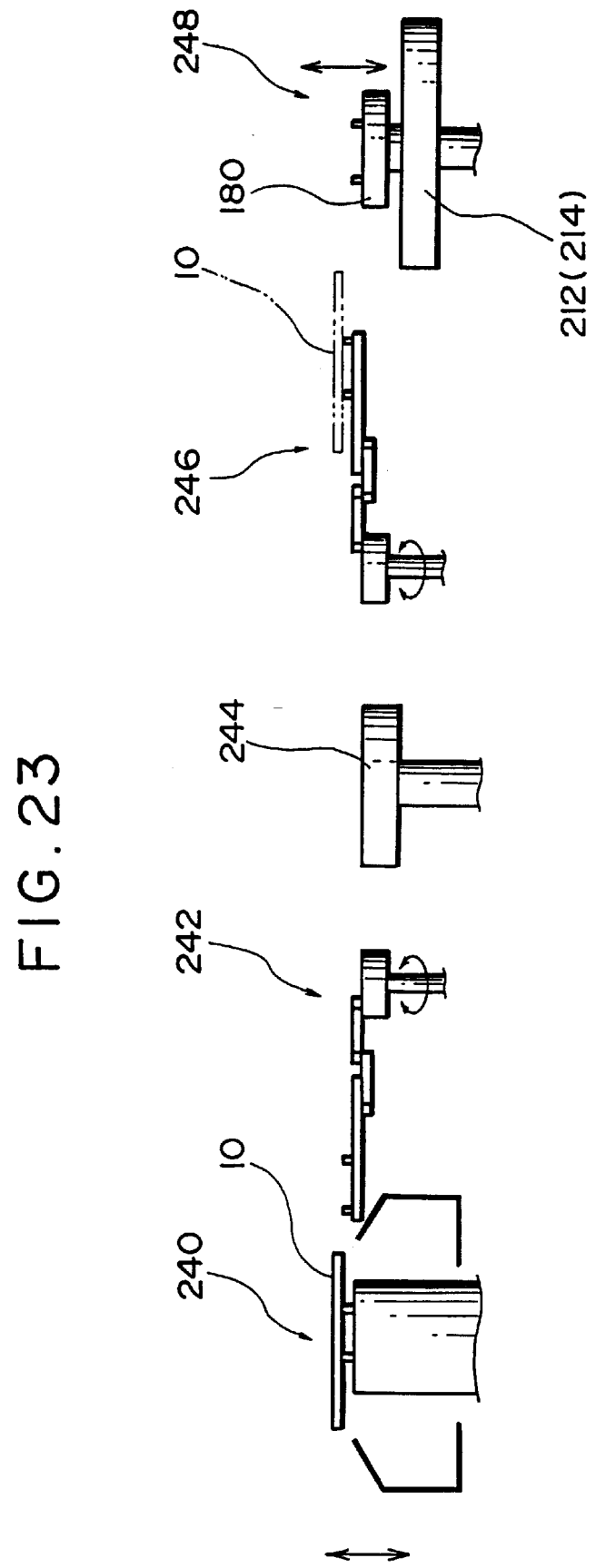
FIG. 23 is an elevational schematic view of the in-line type treatment system shown in FIG. 22.

FIG. 22 shows a schematic plan view of such an in-line type treatment system while FIG. 23 shows a schematic side view of the same system. After silicon wafer 10 has been coated by a coating device 240, it is then delivered onto a stand-by table 244, which may be rotatably driven, by a conveyor arm 242. Silicon wafer 10 is rotated by stand-by table 244 until flat portion 12b thereof is properly oriented and positioned in place. Then, another conveyor arm 246 is actuated to move silicon wafer 10 into a removing device 248 at the proper orientation to align flat portion 12b, as described in connection with any of the herebefore described embodiments. Removing device 248 will perform a removing process as described above to remove unnecessary matter from wafer 10.

Since the removing process performed by removing device 248 requires only about one minute, the coating and removing steps can be carried out in an in-line manner as long as the cycle time in the removing step is substantially equal to that of the coating step performed by coating device 240. If either of the coating and removing steps requires a relatively long time compared to the other, the number of coating devices 240 or removing devices 248 may be increased and each sequentially used in coating or removing.

It is preferred that conveyor arms 242 and 246 and stand-by table 244 do not contact with the underside of edge portion 12 of silicon wafer 10 and only contact the underside of the middle area thereof. This is because coating material deposits on the underside of edge portion 12 of silicon wafer 10 after the coating step and before the removing step. Such a coating material may produce undesirable dust when it is brought into contact with any of the above members due to the removal process.

The present invention is not limited to the aforementioned embodiments, but may be carried out in any of the various modifications and changed forms within the scope of the invention.

If any failure or defect is created by blowing ions excited by the plasma against silicon wafer 10, a metal mesh may be located between the gas outlet(s) of the and the edge portion of the silicon wafer. The metal mesh may catch the ions so that only neutral activated molecules will be blown against silicon wafer 10.

The shapes of the gas outlets or other components may be changed into any of various other shapes to correspond to the contour of the substrate or other workpiece to be treated. The gas outlet may be formed into any suitable shape such as an elongated slit, an annular slit, a corrugated slit or the like, so long as the activated species can be blown against the edge portion of the substrate and not the middle area thereof. In order to blow the gas against edge portion 12 of silicon wafer 10 within a limited range, any suitable air conditioning device utilizing gas exhausting and/or introducing portions may also be provided. The air conditioning device may be in the form of any hydrodynamic device for adjusting the flow of a gas, or to control the flow path of activated species, rather than mechanical means located near the substrate, or in close contact thereof. Such hydrodynamic devices may, for example, include a deflecting plate located at a space away from the substrate and connected to the ground, or a shield plate located at a space away from the substrate for locally limiting the path of gas flow. The hydrodynamic devices here contemplated do not include a member such as a mask or the like that directly contacts the substrate.

It will thus be seen that the objects set forth above, among those made apparent from the preceding description, are efficiently attained and, since certain changes may be made in carrying out the above method and in the constructions set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

It will thus be seen that the objects set forth above, among those made apparent from the preceding description, are efficiently attained and since certain changes may be made in carrying out the above processes and in the constructions set forth without departing from the spirit and scope of the invention, it is intended that all matter contained in the above description and shown in the accompanying diagrams shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A method of removing selected matter on an edge portion of a substrate, said substrate having a top face and a bottom face and a perimeter, said top face having said edge portion at the perimeter thereof, said top face having a middle area surrounded by said edge portion, said method comprising the steps of:

supporting said substrate by a support contacting only said bottom face of said substrate;

applying an AC voltage across a pair of plasma generating electrodes, to generate plasma at or about atmospheric pressure, said plasma generating electrodes being disposed within a gas supply path, said gas supply path having a gas outlet at one end thereof, said gas supply path having a gas capable of plasma discharge flowing therethrough;

activating said gas capable of plasma discharge in said gas supply path by said plasma to form activated gas species and excited molecules;

blowing said activated gas species and excited molecules against said edge portion of said substrate from said gas outlet, said gas outlet being disposed at a position opposed to said edge portion, said gas outlet including a ring-shaped gas passage formed therein at a position corresponding to and opposed to said edge portion;

removing said selected matter from said edge portion of said substrate by reaction of said selected matter with said activated gas species and excited molecules; and exhausting said activated gas species and excited molecules and said removed selected matter away from said middle area of said substrate.

2. The method of removing selected matter of claim 1, wherein said substrate is a semiconductor wafer or liquid crystal substrate which has a flat portion of said edge portion, said flat portion being used to orient placement of said semiconductor wafer or liquid crystal substrate, and said pair of plasma generating electrodes includes a flat electrode part having a configuration corresponding to said flat portion, and further comprising the step of conducting said substrate onto said support while said flat portion of said substrate is oriented in a given direction, thereby setting said flat portion of said substrate at a position directly opposed to said flat electrode part.

3. The method of removing selected matter of claim 1 wherein said substrate has said selected matter on said edge portion thereof, formed from a coating formed on said substrate by spin-coating.

4. The method of removing selected matter of claim 3 wherein said coating is at least one member of the group consisting of silicon oxide, organic resist and polyimide.

5. The method of removing selected matter of claim 1 wherein said gas capable of plasma discharge contains fluorine and said removing step includes etching said selected matter by the use of fluorine radicals formed from said plasma discharge.

6. The method of removing selected matter of claim 1 wherein said gas capable of plasma discharge contains oxygen and said removing step includes ashing said selected matter by the use of oxygen radicals formed from said plasma discharge.

7. The method of removing selected matter of claim 1 wherein said substrate supporting step includes contacting said bottom face of said substrate only at a position opposite said middle area on said bottom face of said substrate and not contacting said edge portion of said substrate, and said removing step includes conducting said activated gas and excited molecules onto said bottom face at said edge portion of said substrate, whereby said selected matter formed on said bottom face of said edge portion will be removed.

8. A method of removing selected matter on an edge portion of a substrate, said substrate having a top face and a bottom face and a perimeter, said top face having a middle portion surrounded by said edge portion at the perimeter, said method comprising the steps of:

supporting said substrate on a support, said support having a ring-shaped configuration defining a ring-shaped gas passageway and contacting only with said bottom face of said substrate;

applying an AC voltage across a pair of plasma generating electrodes, to generate plasma at or about atmospheric pressure said plasma generating electrodes being disposed within a gas supply path through which a gas capable of plasma discharge flows, said gas supply path having a gas outlet at one end thereof;

activating said gas capable of plasma discharge in said gas supply path by said plasma to form activated gas species and excited molecules;

blowing said activated gas species and excited molecules against said edge portion of said substrate from said gas outlet, said gas outlet is disposed at a position opposed to and proximate said edge portion;

removing said selected matter from said edge portion of said substrate by reaction with said activated gas species and excited molecules; and blowing a carrier gas against and outwardly from said middle portion of said top face of said substrate and conducting said carrier gas from said middle portion to said edge portion of said substrate so that said carrier gas prevents said activated gas species and excited molecules and said removed selected matter from depositing on said middle portion of said substrate.

9. The method of removing selected matter of claim 8 wherein said carrier gas blowing step includes blowing a portion of said gas capable of plasma discharge in said gas supply path directly against said middle portion of said substrate without exposure of said gas capable of plasma discharge to said plasma.

10. The method of removing selected matter of claim 8, further comprising the step of exhausting said activated species and excited molecules, said carrier gas and said removed selected matter away from said middle portion for preventing contamination of said middle portion with dust of said selected matter.

11. A method of removing selected matter on an edge portion of a substrate, said substrate having a top face and a bottom face and a perimeter, said top face containing a middle portion surrounded by said edge portion at the perimeter thereof, said method comprising the steps of:

supporting said substrate by a support contacting only with said bottom face of said substrate;

applying an AC voltage across a pair of plasma generating electrodes, said plasma generating electrodes being placed on opposite sides of said edge portion of said substrate only; supplying a gas capable of discharge between said pair of plasma generating electrodes to generate plasma at or about atmospheric pressure proximate said edge portion of said substrate;

activating said gas capable of discharge by said plasma to form activated species and excited molecules; removing said selected matter from said edge portion of said substrate by reaction with said activated species and excited molecules; and exhausting said activated species and excited molecules and said removed selected matter away from said middle portion;

wherein said edge portion includes a first half-circumferential edge portion and a second half-circumferential edge portion; said pair of plasma generating electrodes comprises a first half-circumferential electrode including a pair of electrode portions which correspond to said first half-circumferential edge portion, and a second half-circumferential electrode including a pair of electrode portions which are matched to said second half-circumferential edge portion; and wherein said removing step includes moving at least two of: (a) said substrate, (b) said first half-circumferential electrode and (c) said second half-circumferential electrode relative to each other whereby the respective half-circumferential edge portions of said substrate are positioned opposed to said first half-circumferential electrode and second half-circumferential electrode, respectively.

12. The method of removing selected matter of claim 11 wherein said edge portion includes both a half-circular edge portion and a straight edge portion; and wherein said removing step further includes rotatably changing the position of said half-circular edge portion relative to said straight edge portion relative to said plasma generating electrodes; and linearly changing the position of said flat edge portion relative to said plasma generating electrodes to remove said selected matter from said half-circular edge portion and said straight edge portion of said substrate, respectively.

13. A coating method for coating a substrate, said substrate having a top face and a bottom face, said top face having an edge portion and a perimeter, said top face having a middle area surrounded by said edge portion, said method comprising the steps of:

rotating said substrate about an axis orthogonal to said top surface;

applying a coating material to said top face at a point near said rotation axis to spin-coat a coating on said substrate by centrifugal force;

supporting said substrate by a support contacting only said bottom face of said substrate;

applying an AC voltage across a pair of plasma generating electrodes, to generate plasma at or about atmospheric pressure, said plasma generating electrodes being disposed within a gas supply path, said gas supply path having a gas outlet at one end thereof said gas outlet including a ring-shaped gas passage formed therein at a position corresponding to and opposed to said edge portion, said gas supply path having a gas capable of plasma discharge flowing therethrough;

activating said gas capable of plasma discharge in said gas supply path by said plasma to form activated gas species and excited molecules;

blowing said activated gas species and excited molecules against said edge portion of said substrate from said gas outlet, said gas outlet disposed at a position opposed to and proximate said edge portion;

removing any selected matter from said edge portion of said substrate by reaction with said activated gas species and excited molecules; and exhausting said activated gas species and excited molecules and removed selected matter away from said middle area of said substrate such that said gas is conducted radially.

14. The coating method of claim 13 wherein a plurality of said substrates are sequentially moved to a stage for said removing step after completion of said applying step, whereby said rotating step, said applying and said removing second step can be carried out sequentially in line.

15. A coating method for coating a substrate, said substrate having a top face and a bottom face and a perimeter, said top face having a middle portion surrounded by an edge portion at the perimeter, said method comprising the steps of:

rotating a substrate about an axis orthogonal to said top face;

applying coating material to said top face at a point near said rotation axis to spin-coat a coating on said substrate by centrifugal force;

supporting said substrate on a support, said support having a ring-shaped configuration defining a ring-shaped gas passageway and contacting only with said bottom face of said substrate;

applying an AC voltage across a pair of plasma generating electrodes, to generate plasma at or about atmospheric pressure said plasma generating electrodes disposed within a gas supply path through which a gas capable of plasma discharge flows, said gas supply path having a gas outlet at one end thereof;

activating said gas capable of plasma discharge in said gas supply path by said plasma to form activated gas species and excited molecules;

blowing said activated gas species and excited molecules against said edge portion of said substrate from said gas outlet, said gas outlet is disposed at a position opposed to and proximate said edge portion;

removing selected matter from said edge portion of said substrate by reaction with said activated gas species and excited molecules; and blowing a carrier gas against said middle portion of said top face of said substrate and conducting said carrier gas from said middle portion to said edge portion of said substrate such that said gas is conducted radially so that said carrier gas prevents said activated gas species and excited molecules and said removed selected matter from depositing on said middle portion of said substrate.

* * * * *